US012596162B2

(12) United States Patent
Imai et al.

(10) Patent No.: US 12,596,162 B2
(45) Date of Patent: Apr. 7, 2026

(54) MRI APPARATUS

(71) Applicant: CANON MEDICAL SYSTEMS CORPORATION, Otawara (JP)

(72) Inventors: Satoshi Imai, Nasushiobara (JP); Takaya Mori, Nasushiobara (JP); Yuto Ono, Nasushiobara (JP); Ryota Takei, Shioyaguntakanezawa (JP)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 151 days.

(21) Appl. No.: 18/393,959

(22) Filed: Dec. 22, 2023

(65) Prior Publication Data

US 2024/0210501 A1 Jun. 27, 2024

(30) Foreign Application Priority Data

Dec. 27, 2022 (JP) ................................. 2022-210799
Dec. 21, 2023 (JP) ................................. 2023-215335

(51) Int. Cl.
*G01R 33/34* (2006.01)
*G01R 33/3415* (2006.01)
(Continued)

(52) U.S. Cl.
CPC ... *G01R 33/34084* (2013.01); *G01R 33/3415* (2013.01); *G01R 33/3664* (2013.01); *G01R 33/546* (2013.01); *G01R 33/543* (2013.01)

(58) Field of Classification Search
CPC ............ G01R 33/34084; G01R 33/546; G01R 33/543; G01R 33/3664; G01R 33/3415
See application file for complete search history.

(56) References Cited

U.S. PATENT DOCUMENTS

2007/0103157 A1* 5/2007 Campagna ......... G01R 33/3415
324/318
2008/0007263 A1 1/2008 Machida et al.
(Continued)

FOREIGN PATENT DOCUMENTS

CN 110007258 A 7/2019
JP 2010-158295 A 7/2010
(Continued)

OTHER PUBLICATIONS

English translation of JP2012205660A provided by Espacenet. (Year: 2025).*

(Continued)

*Primary Examiner* — Rishi R Patel
(74) *Attorney, Agent, or Firm* — Oblon, McClelland, Maier & Neustadt, L.L.P.

(57) ABSTRACT

In one embodiment, An MRI apparatus comprising: an RF coil that includes a plurality of coil elements and can be installed in an arbitrary orientation with either a front surface or back surface brought into contact with the object; a table on which the object is placed; and processing circuitry configured to acquire an MR "Magnetic Resonance" signal in a first scan along any one axis from each of a plurality of representative coils selected from the plurality of coil elements, detect respective positions of the plurality of representative coils along the one axis based on MR signals, and determine disposition of the RF coil relative to the table based on the respective positions of the plurality of representative coils.

21 Claims, 28 Drawing Sheets

(51) Int. Cl.
     *G01R 33/36*     (2006.01)
     *G01R 33/54*     (2006.01)

(56)                    References Cited

U.S. PATENT DOCUMENTS

| | | | |
|---|---|---|---|
| 2009/0182221 A1* | 7/2009 | Kasugai | G01R 33/56375 |
| | | | 600/410 |
| 2014/0145717 A1 | 5/2014 | Ozawa et al. | |
| 2015/0253404 A1* | 9/2015 | Tomiha | G01R 33/3692 |
| | | | 324/322 |
| 2022/0229127 A1 | 7/2022 | Kawajiri | |

FOREIGN PATENT DOCUMENTS

| | | | | |
|---|---|---|---|---|
| JP | 2012205660 A | * | 10/2012 | G01R 33/3415 |
| JP | 2014-128630 A | | 7/2014 | |

OTHER PUBLICATIONS

English translation of CN110007258 provided by Espacenet. (Year: 2025).*
Extended European Search Report Issued May 8, 2024 in European Application 23219864.8, 10 pages.

* cited by examiner

Figure 15:
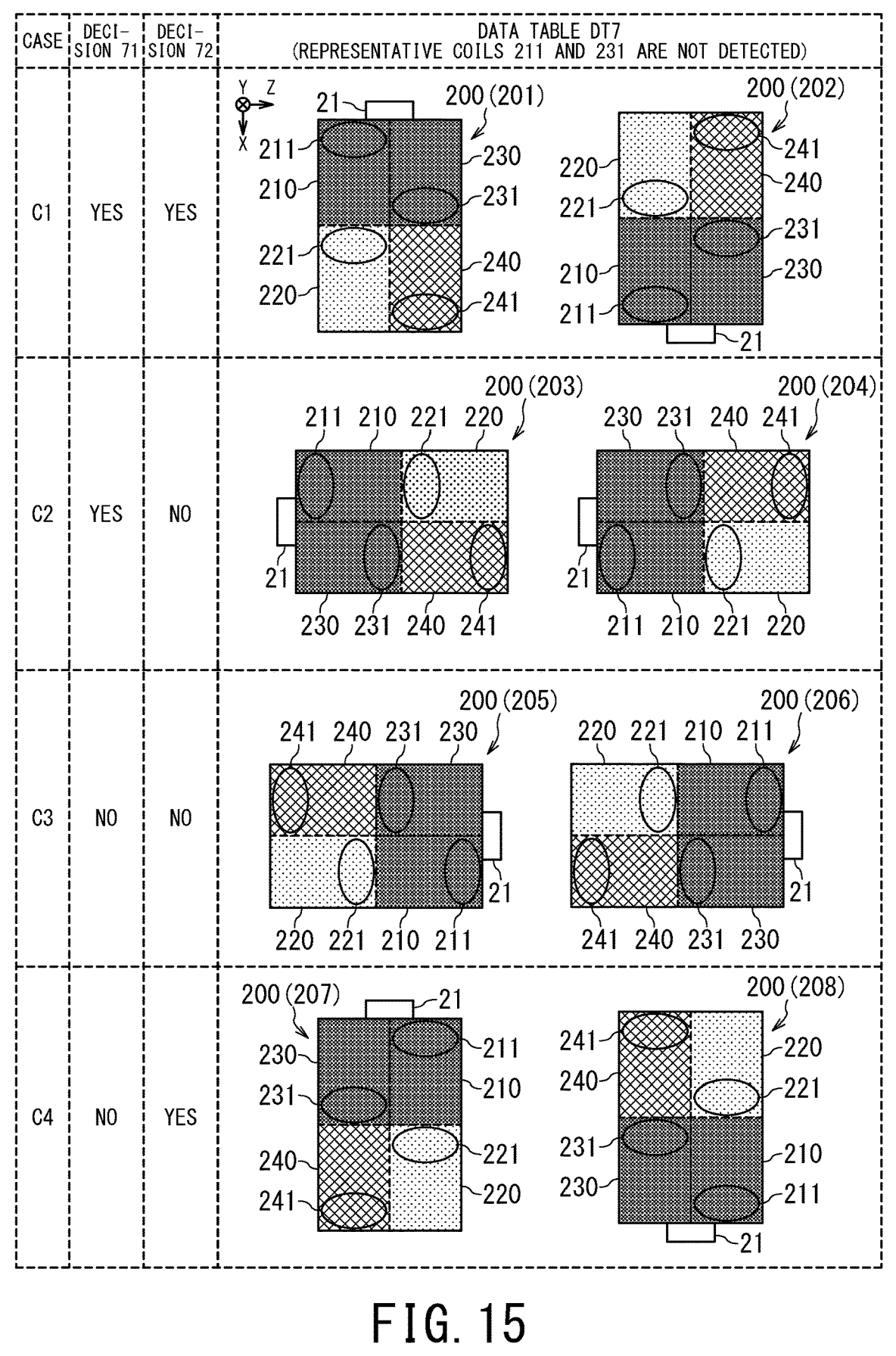

| CASE | DECI- SION 71 | DECI- SION 72 | DATA TABLE DT7 (REPRESENTATIVE COILS 211 AND 231 ARE NOT DETECTED) |
|---|---|---|---|
| C1 | YES | YES | |
| C2 | YES | NO | |
| C3 | NO | NO | |
| C4 | NO | YES | |

MRI APPARATUS

CROSS-REFERENCE TO RELATED APPLICATION

This application claims the benefit of priority of Japanese Patent Application No. 2022-210799, filed on Dec. 27, 2022, and Japanese Patent Application No. 2023-215335, filed on Dec. 21, 2023, the entire contents of which are incorporated herein by reference.

TECHNICAL FIELD

Disclosed Embodiments relate to a magnetic resonance imaging (MRI) apparatus.

BACKGROUND

An MRI apparatus is an imaging apparatus that magnetically excites nuclear spin of an object placed in a static magnetic field by applying a radio frequency (RF) signal having the Larmor frequency and reconstructs an image on the basis of magnetic resonance (MR) signals emitted from the object due to the excitation.

A receiving coil such as a WB (Whole Body) coil and an RF coil is used to receive MR signals emitted from the object. The RF coil to be disposed close to the object includes various models such as those for the head, for the chest, for the spine, and for the lower limbs. In order to generate an MR image with satisfactory image quality when the RF coil is composed of a plurality of coil elements, in a known technique, at least one coil element disposed at a position where sufficient reception sensitivity is obtained is specified and selected as an effective coil element for a diagnostic scan, for example.

The RF coil to be disposed close to the object includes not only the type of RF coil having a fixed shape as described above but also a deformable RF coil of the following configuration. That is, this deformable RF coil deforms into a desired shape according to the body shape of the object and the anatomical imaging part, for example, and can be installed with either its front surface or its back surface brought into contact with the object, and can be installed in an arbitrary orientation. In the case of using such a deformable RF coil that has a certain degree of freedom in disposition, MR images of anatomical imaging parts having wider range, such as limbs and joints as well as the trunk of an object, can be obtained. However, due to its deformable shape and degree of freedom in its disposition, it is difficult to distinguish between the front surface and the back surfaces of the RF coil and to determine its orientation. Thus, there is a problem that it is difficult to specify and select an effective element coil for a diagnostic scan from a plurality of coil elements provided in the RF coil.

BRIEF DESCRIPTION OF THE DRAWINGS

In the accompanying drawings:

FIG. 15 is a schematic diagram illustrating the seventh aspect of the data table according to the embodiment;

FIG. 24 is a schematic diagram illustrating a configuration of an MRI apparatus according to the second embodiment;

DETAILED DESCRIPTION

Hereinbelow, embodiments of an MRI apparatus will be described in detail by referring to the accompanying drawings.

In one embodiment, An MRI apparatus comprising: an RF coil that includes a plurality of coil elements and can be installed in an arbitrary orientation with either a front surface or back surface brought into contact with the object; a table on which the object is placed; and processing circuitry configured to acquire an MR "Magnetic Resonance" signal in a first scan along any one axis from each of a plurality of representative coils selected from the plurality of coil elements, detect respective positions of the plurality of representative coils along the one axis based on MR signals, and determine disposition of the RF coil relative to the table based on the respective positions of the plurality of representative coils.

In the following description, the term "disposition" refers to a concept that includes the front surface and the back surface of the RF coil, the orientation of the Rf coil, and the position of the RF coil. The front surface is defined as the first surface of the RF coil, and the back surface is defined as the second surface that is opposite to the first surface of the RF coil.

First Embodiment: Overall Configuration and Basic Operation

Figure 1:
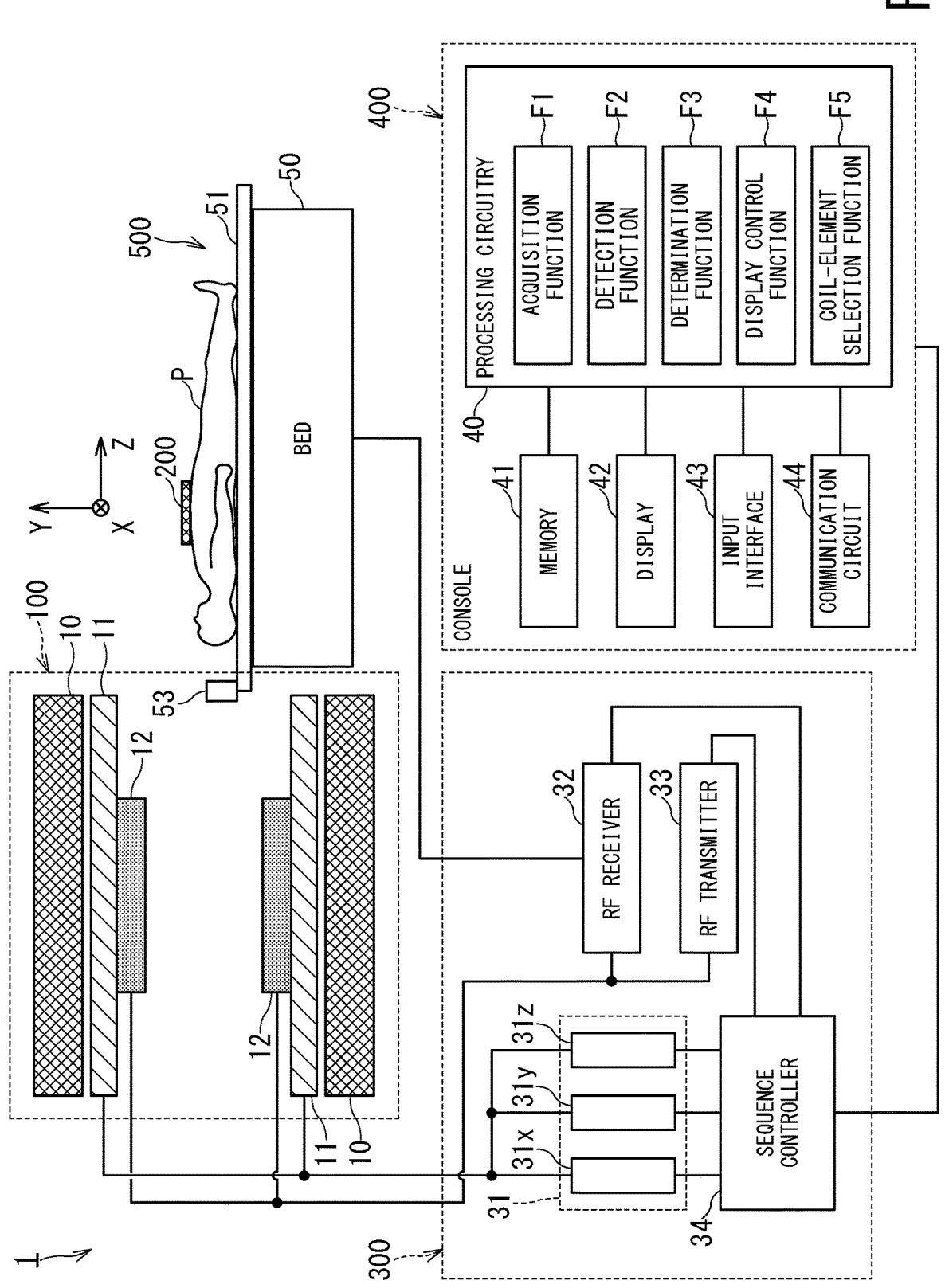
FIG. 1 is a schematic diagram illustrating a configuration of an MRI apparatus according to one embodiment.

An MRI apparatus 1 according to each embodiment of the present invention can utilize magnetic resonance imaging technology. FIG. 1 is a block diagram illustrating a configuration of the MRI apparatus 1 according to the embodiment. The MRI apparatus 1 includes a gantry 100, a control cabinet 300, an image processing device (for example, a console) 400, and a bed 500.

The gantry 100 and the bed 500 are disposed in a shielded room called an examination room, for example. The control cabinet 300 is disposed in a machine room, for example. The console 400 is disposed in a control room, for example. Note that the console 400 may be installed at a remote location away from the control room and may be interconnected to the MRI apparatus 1 via a network.

The gantry 100 includes, for example, a static magnetic field magnet 10, a gradient coil 11, and a whole body (WB) coil 12, and these components are housed in a cylindrical housing. The bed 500 includes a bed body 50 and a table 51. The MRI apparatus 1 also includes at least one RF coil 200 to be disposed close to an object P. The RF coil 200 and the table 51 of the MRI apparatus 1 are configured to be connectable to each other. As shown in FIG. 1, the three orthogonal axes are defined as follows: the axis along the longitudinal direction of the table 51 is the Z-axis, the axis along the gravitational direction, i.e., the axis along the thickness direction of the table 51 is the Y-axis; and the axis along the width direction of the table 51 is the X-axis.

The control cabinet 300 includes three gradient coil power supplies 31 (31x for the X-axis, 31y for the Y-axis, and 31z for the Z-axis), an RF receiver 32, an RF transmitter 33, and a sequence controller 34.

The static magnetic field magnet 10 of the gantry 100 is substantially in the form of a cylinder and generates a static magnetic field inside a bore, which is a space inside the cylindrical structure of the static magnetic field magnet 10 and is also an imaging region of the object P. The static magnetic field magnet 10 includes a superconducting coil inside, and the superconducting coil is cooled down to an extremely low temperature by liquid helium. The static magnetic field magnet 10 generates a static magnetic field by applying an electric current provided from a static magnetic field power supply (not shown) to the superconducting coil in an excitation mode. Afterward, the static magnetic field magnet 10 shifts to a persistent current mode, and the static magnetic field power supply is disconnected. Once it shifts to the persistent current mode, the static magnetic field magnet 10 continues to generate a strong static magnetic field for a long time, for example, over one year. Note that the static magnetic field magnet 10 may be configured as a permanent magnet.

The gradient coil 11 is also substantially in the form of a cylinder and is fixed to the inside of the static magnetic field magnet 10. This gradient coil 11 is composed of coils that generate gradient magnetic fields in the respective directions of X-axis, Y-axis, and Z-axis. The three gradient coils generate gradient magnetic fields in the respective directions of the X-axis, Y-axis, and Z-axis by being supplied with gradient magnetic field currents from the respective gradient coil power supplies 31x, 31y, and 31z, and then apply the generated gradient magnetic fields to the object P.

The bed body 50 of the bed 500 can move the table 51 in the vertical direction and the horizontal direction. It moves the table 51 with the object P placed thereon to a predetermined height before imaging. Afterward, when the object P is imaged, the bed body 50 moves the table 51 in the horizontal direction so as to move the object P to the inside of the bore.

The WB coil 12 is shaped substantially in the form of a cylinder so as to surround the object P and is fixed to the inside of the gradient coil 11. The WB coil 12 applies RF pulses transmitted from the RF transmitter 33 to the object P, and receives MR signals emitted from the object P due to excitation of hydrogen nuclei.

The RF coil 200 receives MR signals emitted from the object P at a position close to the object P. The MRI apparatus 1 according to the embodiment is configured to enable use of a special RF coil 200 that is more flexible and more versatile than conventional RF coils. This RF coil 200 has flexibility like a blanket, for example. In the case of using this RF coil 200, the imaging part such as the chest and/or abdomen of the object P can be imaged by disposing the RF coil 200 thereon, while a cylindrical imaging part such as the legs and/or arms can be imaged by being wrapped by the RF coil 200. This special RF coil 200 is sometimes referred to as a "Shape Coil", for example. The configuration and features of the RF coil 200 will be described below in detail.

Note that the MRI apparatus 1 can also use conventional but relatively specialized RF coils, such as a head coil, a chest coil, a spine coil, and a knee coil.

The RF transmitter 33 transmits each RF pulse to the WB coil 12 on the basis of an instruction from the sequence controller 34. The RF receiver 32 receives MR signals detected by the WB coil 12 and/or the RF coil 200, and transmits raw data obtained by digitizing the detected MR signals to the sequence controller 34.

The sequence controller 34 performs a scan of the object P by driving the gradient coil power supplies 31, the RF transmitter 33, and the RF receiver 32 under the control of the console 400. Upon receipt of the raw data acquired by the scan from the RF receiver 32, the sequence controller 34 transmits the raw data to the console 400.

The sequence controller 34 includes processing circuitry (not shown). This processing circuitry is configured as a processor, which executes predetermined programs, or is configured as hardware such as a field programmable gate array (FPGA) and an application specific integrated circuit (ASIC), for example.

The console 400 includes a memory 41, an input interface 43, a display 42, and processing circuitry 40. The console 400 may include a communication circuit 44.

The memory 41 is a recording medium including a read-only memory (ROM) and/or a random access memory (RAM) in addition to an external memory device such as a hard disk drive (HDD) and an optical disc device. The memory 41 stores various programs to be executed by the processor of the processing circuitry 40 as well as various data and information.

The input interface 43 includes various devices for a user to input various data and information, and is configured of a mouse, a keyboard, a trackball, and/or a touch panel, for example.

The display 42 is a display device such as a liquid crystal display panel, a plasma display panel, and an organic EL panel. In addition, the display 42 may be a display device and a GUI (Graphical User Interface) that can receive various operations from the user such as a touch panel. The communication circuit 44 is a wired or wireless interface that allows communication with various devices connected to the network and exchange various data and information.

The processing circuitry 40 is a circuit provided with a central processing unit (CPU) and/or a special-purpose or general-purpose processor, for example. The processor implements various functions described below by executing the programs stored in the memory 41. The processing circuitry 40 may be configured of hardware such as an FPGA and an ASIC. The various functions described below can also be implemented by such hardware. Additionally, the processing circuitry 40 can implement the various functions by combining hardware processing and software processing based on its processor and programs.

The console 400 controls the entirety of the MRI apparatus 1 by using each of these components. For example, the console 400 receives information on the anatomical imaging part, other information such as imaging conditions, and instructions in response to an operation on the input interface 43 (e.g., mouse and/or keyboard) by a user such as a medical imaging technologist. The processing circuitry 40 causes the sequence controller 34 to perform a scan on the basis of the inputted information such as the imaging conditions, and then reconstructs an image on the basis of the data sent from the sequence controller 34. The reconstructed image is displayed on the display 42 or stored in the memory 41.

(RF Coil)

As described above, the MRI apparatus 1 according to the embodiment is configured to be able to use the special RF coil 200 that is more flexible and versatile than the conventional RF coil. In addition, the RF coil 200 can be flexibly deformed into a desired shape according to the body shape of the object P and the anatomical imaging part for example, and can be disposed on a wide range of anatomical imaging parts including not only the trunk of the body of the object P but also cylindrical extremities and joints.

Figure 2A:
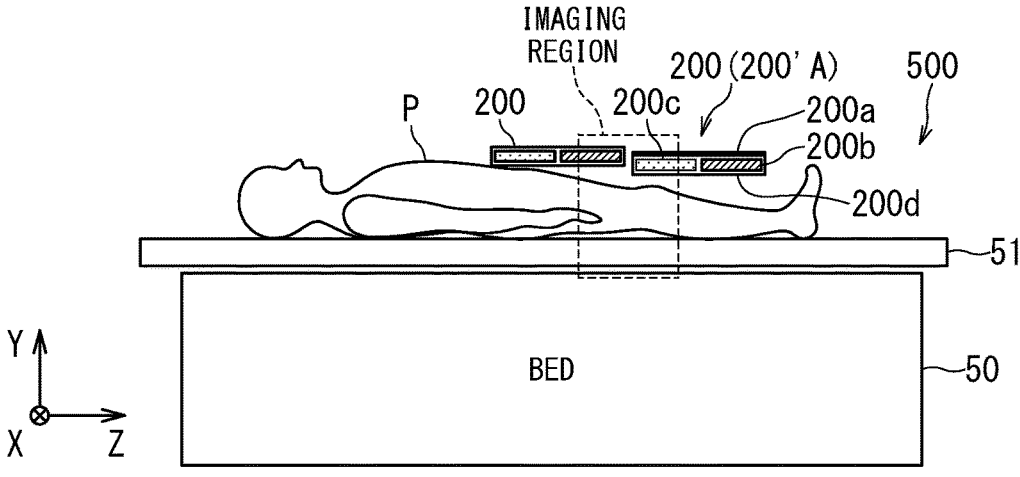
FIG. 2A to FIG. 2C are schematic diagrams illustrating disposition of a plurality of RF coils in the MRI apparatus according to the embodiment.
Figure 2B:
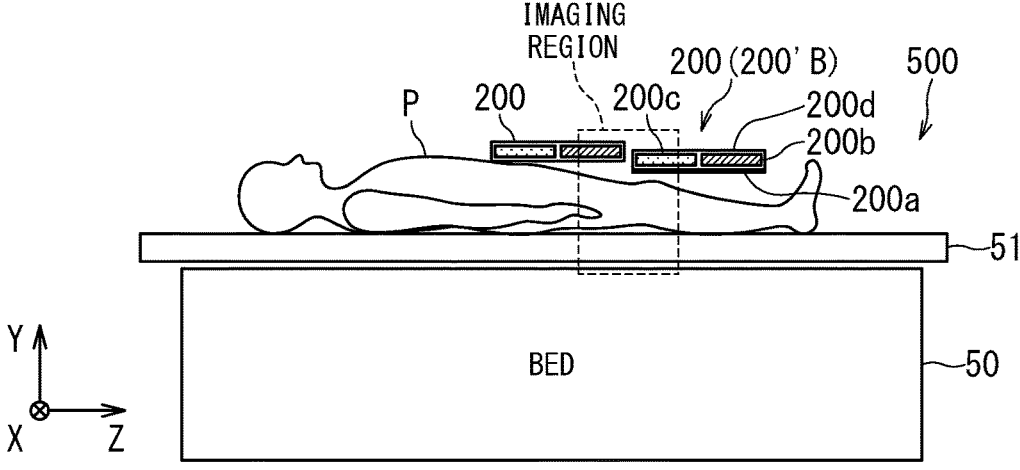
Figure 2C:
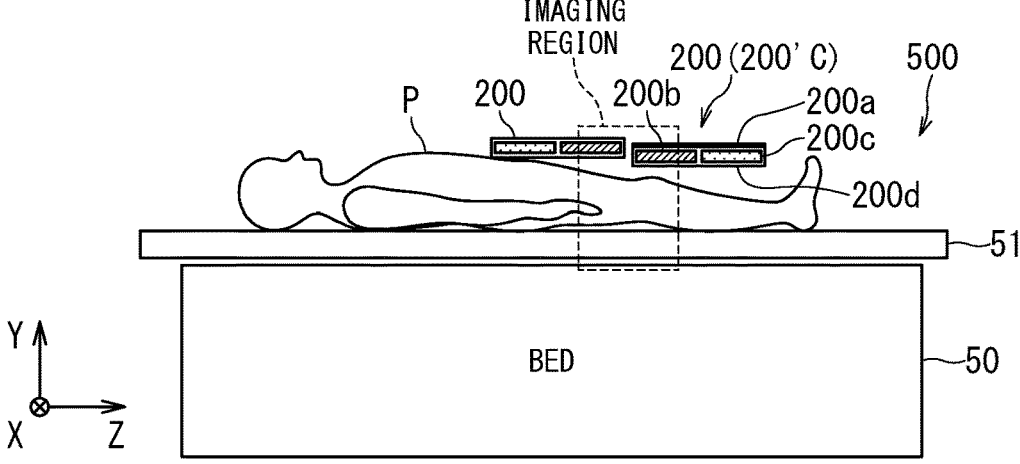

FIG. 2A to FIG. 2C are schematic diagrams illustrating disposition of a plurality of RF coils 200 in the MRI apparatus 1. In FIG. 2A to FIG. 2C, the two RF coils 200 having the same structure and function are disposed on the object P. Each of three reference signs 200'A, 200'B, and 200'C refers to the RF coil having the same structure and function as the RF coil 200 but having different disposition on the object P (hereinafter referred to as disposition 200'A, 200'B, and 200'C). Although the front surface 200a of the RF coil 200 is indicated by a thick line in each of FIG. 2A to FIG. 2C to facilitate recognition, it does not represent the difference in structure between the front surface 200a and its back surface 200d opposite to the front surface 200a. Although partial coils 200b and 200c, which is respectively configured of one or more coil elements and constitutes part of the RF coil 200, are denoted as a dotted region or an oblique-line region, it does not represent the difference in structure between the two partial coils 200b and 200c.

The RF coil 200 being composed of a plurality of coil elements is highly versatile, such that it can be disposed with either its front surface 200a or back surface 200d brought into contact with the object P and can be installed in an arbitrary orientation. For example, the disposition 200'B in FIG. 2B is obtained by reversing the front surface 200a and the back surface 200d from the disposition 200'A in FIG. 2A, and the disposition 200'C in FIG. 2C is obtained by reversing the orientation of the two partial coils 200b and 200c in the Z-axis direction from the disposition 200'A in FIG. 2A. In such a manner as described above, either the front surface 200a or the back surface 200d may be oriented outward relative to the object P or may be brought into contact with the object P. In addition, the RF coil 200 can be rotated on the disposition plane such that it can be installed in any orientation relative to the object P.

For example, when the imaging region of the object P is set across two RF coils 200 as shown in FIG. 2A to FIG. 2C and the number of inputs to be received by the RF receiver 32 is limited, one or more coil elements effective for a diagnostic scan are specified and selected from the plurality of coil elements provided in the RF coil 200.

However, each RF coil 200 is deformable and has a degree of freedom in its disposition, which makes it difficult to specify or select the effective coil elements for the diagnostic scan. For example, in the disposition 200'A in FIG. 2A and in the disposition 200'B in FIG. 2B, the plurality of coil elements constituting the partial coil 200c are the effective coil elements. In the disposition 200'C in FIG. 2C, the plurality of coil elements constituting the partial coil 200b, which is different from the partial coil 200c, are the effective coil elements. Thus, the effective coil elements for the diagnostic scan are different depending on the disposition of the RF coils 200.

In order to specify and select the effective coil elements for the diagnostic scan from the plurality of coil elements provided in the RF coil 200, it is necessary to determine the front and back surfaces and the orientation of each RF coil 200. Hereinbelow, a description will be given of respective configurations of sections of the RF coils 200, representative coils, and the coil elements of the RF coils 200, which are used to determine the front and back surfaces and the orientation of each RF coil 200, by referring to FIG. 3 and FIG. 4.

Figure 3:
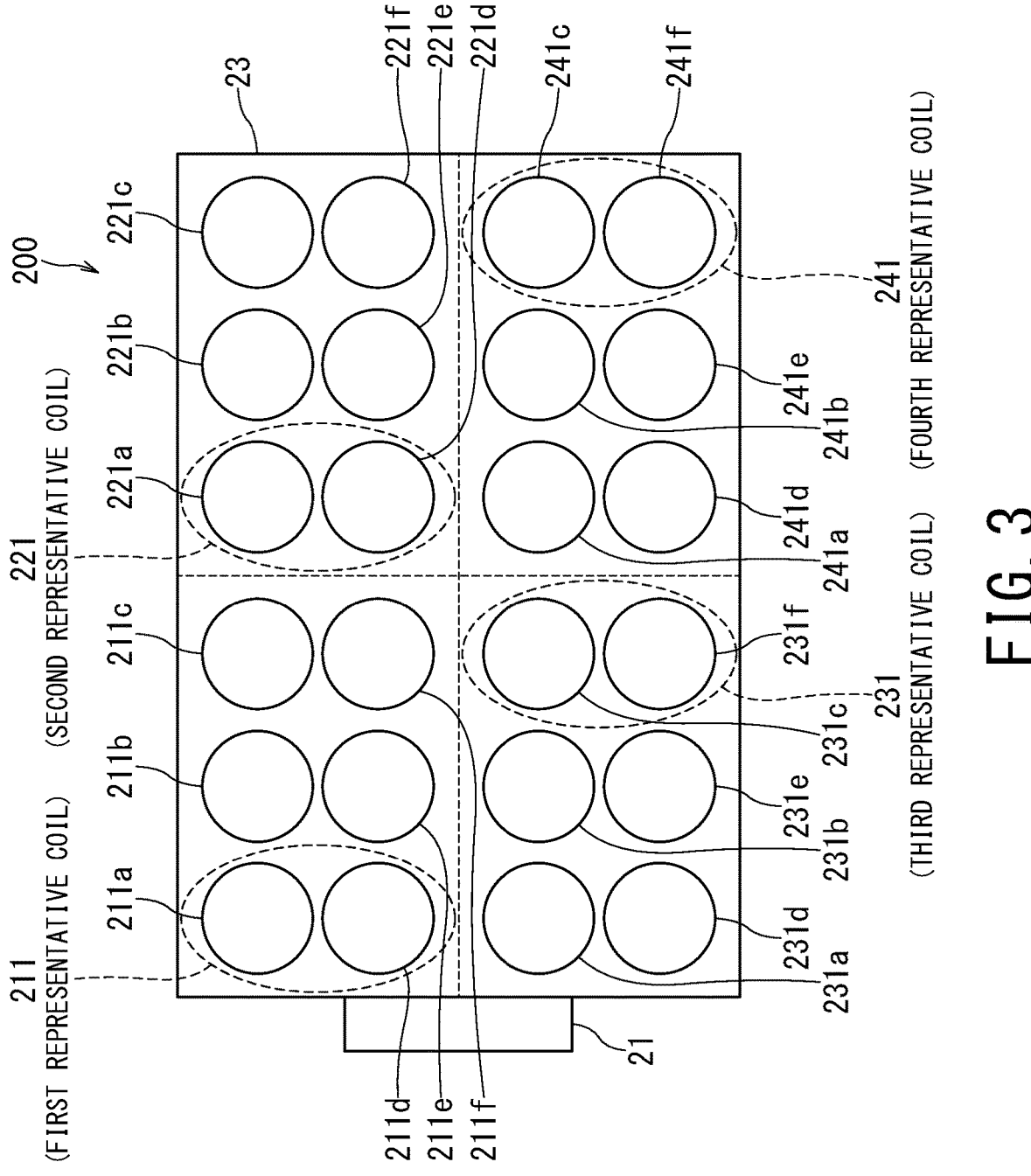
FIG. 3 is a schematic diagram illustrating a configuration of coil elements and representative coils in the RF coils according to the embodiment.

The RF coil 200 has a rigid portion 21, a cable 22, and a cover member 23 having a plurality of coil elements in its inside. FIG. 3 shows a state in which the RF coil 200 is composed of 24 coil elements 211a to 211f, 221a to 221f, 231a to 231f, and 241a to 241f. Respective MR signals received by the plurality of coil elements of the RF coil 200 are inputted to the RF receiver 32.

Figure 4:
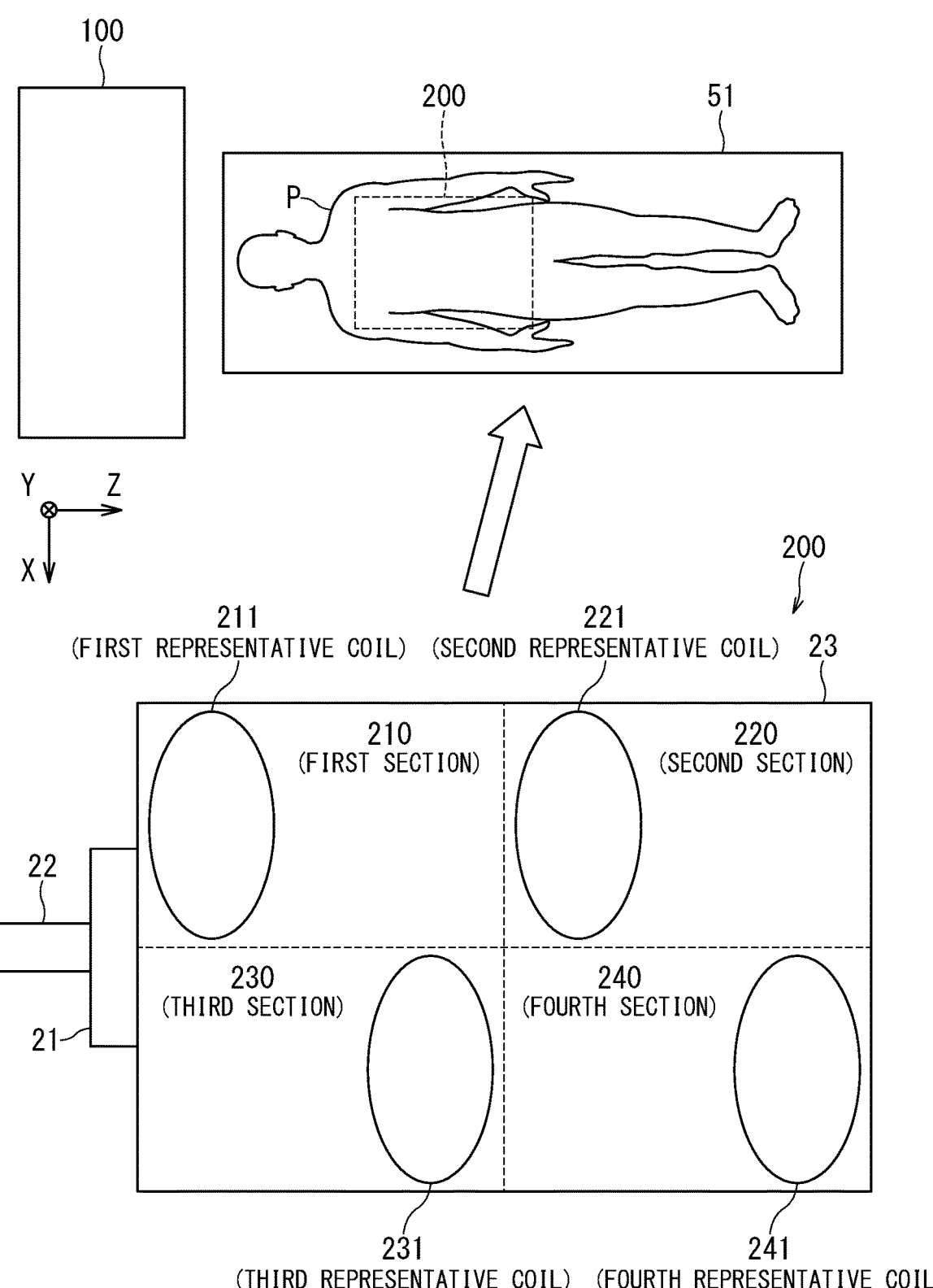
FIG. 4 is a schematic diagram illustrating the representative coils of the RF coils in FIG. 3 and a configuration of sections.

For example, as shown in FIG. 4, the plurality of coil elements of the RF coil 200 are individually electrically connected to separate wires in the cable 22 by a known circuit configuration including respective amplifier circuits in the rigid portion 21 and in the cover member 23. The cable 22 has a connector (not shown) at its tip, and the plurality of coil elements are connected to the RF receiver 32 by connecting this connector to a connection port 53.

The number of channels of the RF coil 200 is set to equal to or less than the number of inputs that can be received by the RF receiver 32. The channel means the respective paths of the plurality of MR signals between the RF coil 200 and the RF receiver 32, i.e., the path of each MR signal to be outputted from the RF coil 200 and then be inputted to the RF receiver 32. The MR signal to be transmitted through each channel and inputted as one signal to the RF receiver 32 may be composed of the MR signal from only one coil element or may be the MR signal from one combined or composite coil in which the plurality of coil elements are combined or composed, i.e., a composite signal. The composite processing of MR signals is performed by converting each of the MR signals from the plurality of coil elements of the RF coil 200 into the same phase, antiphase, QD (quadrature), or half QD and then summing them up in such a manner that each of the original MR signals can be individually extracted in the post-processing, for example.

The representative coils are selected from one or more coil elements in each section so as to represent each of the plurality sections that are obtained by virtually dividing a development plane of the RF coil 200 into a plurality of regions. The development plane is a plane in which the deformable RF coil 200 is developed or expanded into a substantially planar shape.

The representative coil may be one coil element or may be one composite coil obtained by composing a plurality of coil elements. In FIG. 3 and FIG. 4, a total of four representative coils are shown including a first representative coil 211 obtained by composing two coil elements 211*a* and 211*d*, a second representative coil 221 obtained by composing two coil elements 221*a* and 221*d*, a third representative coil 231 obtained by composing two coil elements 231*c* and 231*f*, and a fourth representative coil 241 obtained by composing two coil elements 241*c* and 241*f*. Each representative coil is composed of one or more coil elements. From FIG. 4 onwards, a description will be given of the case where each representative coil is one composite coil composed of a plurality of (for example, two) coil elements.

Next, the relationship between the sections and the representative coils will be described. In FIG. 4, for example, when the first direction of the RF coil 200 is defined as the Z-axis direction and the second direction is defined as the X-axis direction, the plurality of sections are four sections obtained by dividing the development plane of the RF coil 200 into two in the first direction and two in the second direction orthogonal to the first direction. In FIG. 4, the four sections are the first section 210, the second section 220, the third section 230, and the fourth section 240. The first representative coil 211, the second representative coil 221, the third representative coil 231, and the fourth representative coil 241 respectively represent the first section 210, the second section 220, the third section 230, and the fourth section 240.

Both the number of coil elements constituting each section and the number of coil elements constituting the representative coil representing each section may be an arbitrary number of one or more, which can be selected depending on the total number of coil elements constituting the RF coil 200. For example, in FIG. 3, the four coil elements 211*a*, 211*b*, 211*d*, and 211*e* constitute one section, and one coil element 211*a* may be selected from these four coil elements 211*a*, 211*b*, 211*d*, and 211*e*.

As in this case, the plurality of sections may be six sections obtained by dividing the development plane into two in the first direction and three in the second direction or may be eight sections obtained by dividing it into two in the first direction and four in the second direction, for example. The plurality of sections are two or more sections obtained by dividing the development plane of the RF coil 200 into two or more in at least one direction of the first direction and the second direction orthogonal to each other.

The plurality of sections may be divided in such a manner that MR signals can be received from at least one representative coil among the representative coils representing the respective sections. For example, when the RF coil 200 formed into a shape particularly long in one arbitrary direction of the first direction or the second direction is disposed on the object P, the number of section divided in that arbitrary direction may be increased.

On the basis of the respective configurations of the sections, the representative coils, and the coil elements of the RF coil 200, a detailed description will be given of the operation for determining the disposition of the RF coil 200, which can be installed in an arbitrary orientation with either its front surface or its back surface brought into contact with the object P, and operation for displaying the determination result on the GUI.

(Determination on RF Coil Disposition and GUI Display)

Figure 5:
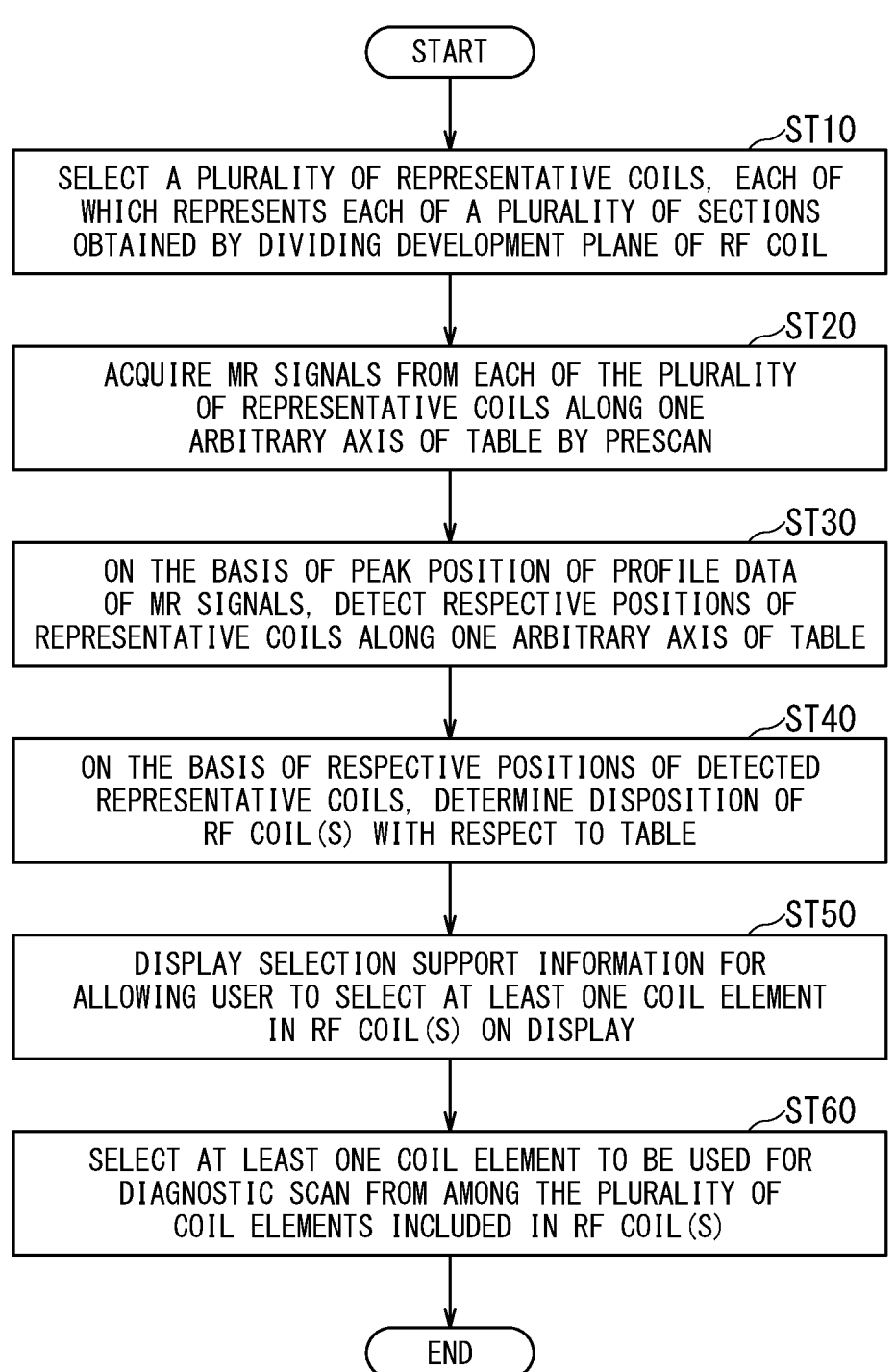
FIG. 5 is a flowchart illustrating operation to be executed by the MRI apparatus according to the embodiment.

As shown in FIG. 1, the processing circuitry 40 implements each of an acquisition function F1, a detection function F2, a determination function F3, a display control function F4, and a coil-element selection function F5. The configuration and operation of each of the above-described functions of the processing circuitry 40 will be described by referring to FIG. 6 to FIG. 18 and a flowchart of FIG. 5 illustrating the operation of the MRI apparatus 1 according to the embodiment.

First, the object P is placed on the table 51 of the bed 500. Afterward, the user sets the RF coil 200 on the object P on the basis of the preset conditions such as examination type and examination title. The processing circuitry 40 receives various information such as information on the anatomical imaging part, imaging conditions, and the type of the RF coil 200. In the setting of the RF coil 200, either the front surface or the back surface of the RF coil 200 can be brought into contact with the object P, and the RF coil 20 can be installed in an arbitrary orientation. After the setting of the RF coil 200, the table 51 is horizontally moved so as to move the object P into the bore.

In the step ST10, the acquisition function F1 selects a plurality of representative coils in such a manner that the selected representative coils represent the respective sections obtained by virtually dividing the development plane of the RF coil 200 into a plurality of regions.

As described above, the plurality of sections are two or more sections obtained by dividing the development plane of the RF coil 200 into two or more in at least one of the first direction and the second direction orthogonal to the first direction. In addition, each representative coil is selected from one or more coil elements in each section in such a manner that the selected representative coil represents each of the plurality of sections obtained by dividing the development plane of the RF coil 200 into a plurality of regions.

The representative coils are selected in such a manner that two representative coils adjacent to each other in the first direction are at different positions in the second direction, or in such a manner that two representative coils adjacent to each other in the second direction are at different positions in the first direction. When the representative coils are selected in this manner, the disposition of the RF coil 200 relative to the table 51 can be determined more accurately with a smaller number of representative coils.

For example, in FIG. 3 or FIG. 4, the representative coils are selected in such a manner that the two representative coils adjacent to each other along the Z-axis direction are at different positions in the X-axis direction. In this case, the positions of the first and third representative coils 211 and 231, the third and second representative coils 231 and 221, and the second and fourth representative coils 221 and 241 are respectively different in the X-axis direction.

For example, the representative coils are selected in such a manner that the two representative coils adjacent to each other along the X-axis direction are at different positions in the Z-axis direction. In this case, the positions of the first and third representative coils 211 and 231, and the second and fourth representative coils 221 and 241 are respectively different in the Z-axis direction.

Returning to FIG. 5, in the step ST20, the acquisition function F1 acquires the MR signals in a prescan along any one axis from each of the plurality of representative coils that are selected from the plurality of coil elements.

The first scan may be a prescan and the second scan may be a diagnostic scan. In a prescan, a calibration scan is performed to acquire appropriate diagnostic images, for example, including adjusting the transmitting/receiving RF gain, adjusting the center frequency, determining a specific coil. Whereas in a diagnostic scan, an imaging scan is performed to acquire diagnostic images of object with reflecting the result of the prescan.

Under the control of the console 400, the sequence controller 34 performs the prescan for acquiring MR signals along any one axis by applying a readout direction gradient magnetic field with a pulse sequence based on a spin echo technique, for example. The MR signals acquired from each of the representative coils are received by the RF receiver 32. The one axis may be the axis along the longitudinal direction of the table 51, i.e., the Z-axis. The one axis may be the X-axis or the Y-axis that is orthogonal to the Z-axis. The imaging region for acquiring the MR signals in the prescan may be set as the maximum FOV (Field Of View) including the magnetic field center, or may be set to include the imaging region of the diagnostic scan, for example. The imaging region (for example, −Pz to +Pz in FIG. 6) for receiving the MR signals in the prescan may be a region of −200 mm to +200 mm along any one axis.

In the step ST30, the detection function F2 detects the respective positions of the plurality of representative coils along any one axis on the basis of the acquired MR signals.

Figure 6:
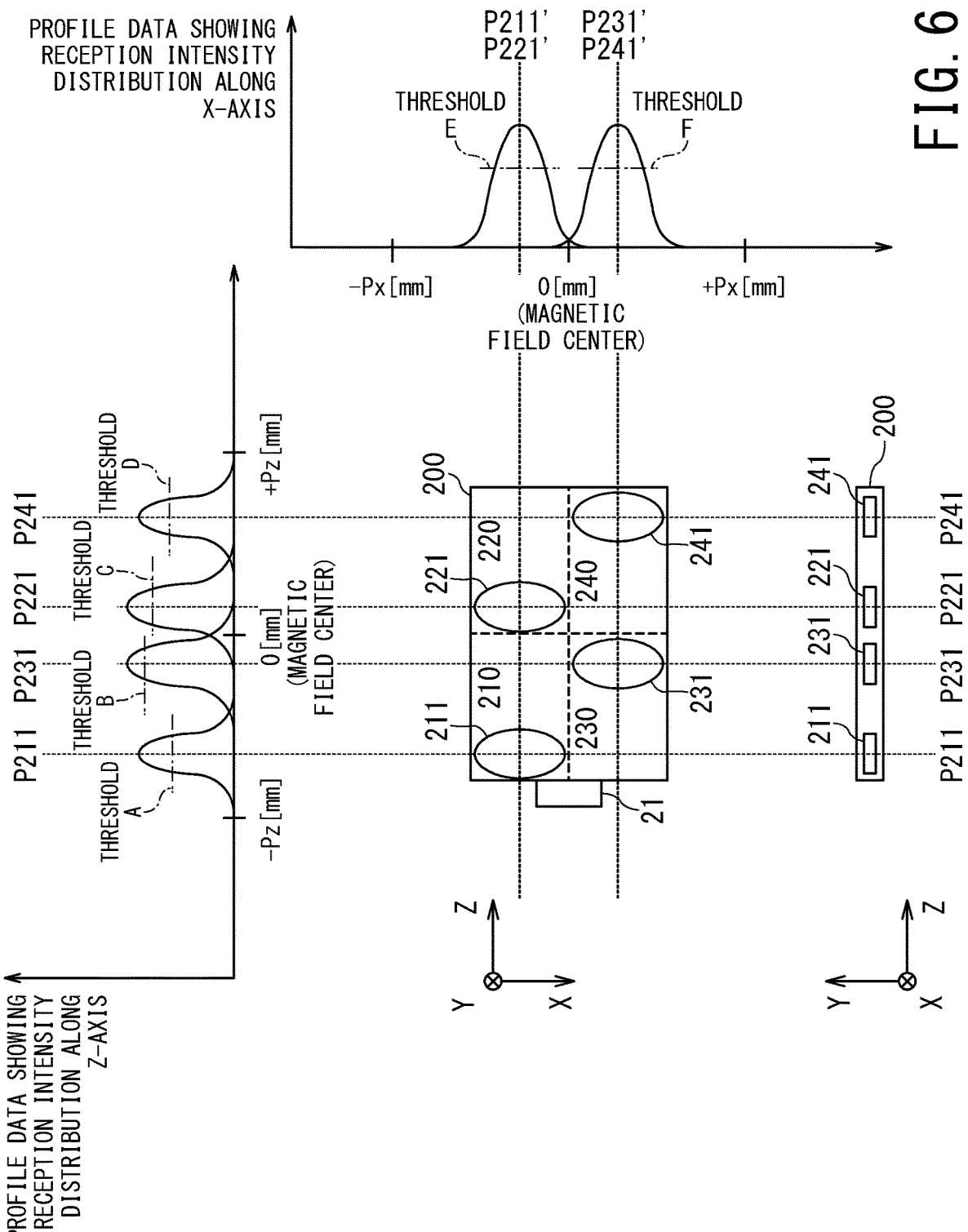
FIG. 6 is a schematic diagram illustrating detection of the respective positions of the representative coils based on MR signals that are acquired in a prescan according to the embodiment.

FIG. 6 is a schematic diagram illustrating detection of the respective positions of the representative coils based on the MR signals that are acquired in the prescan according to the embodiment. As shown in FIG. 6, the reception intensity distributions of the respective representative coils of the RF coil 200 are individually generated as profile data that can be acquired by performing one-dimensional FFT (Fast Fourier Transform) on the MR signals acquired in the step ST20. FIG. 6 illustrates the profile data indicative of the reception intensity distribution of each representative coil along the X-axis and the Z-axis. Hereinafter, detection of the respective positions of the representative coils along the Z-axis, as any one axis, will be described.

The detection function F2 detects the respective positions of the representative coils along any one axis (i.e., Z-axis) on the basis of the profile data showing the reception intensity distribution of the MR signals in the prescan.

For detection of the respective positions of the representative coils along the Z-axis, a known detection method based on the profile data indicating the reception intensity distribution of the MR signals in the prescan can be used.

For example, a detection method using the peak positions shown in the profile data can be used.

Specifically, as shown in FIG. 6, in the profile data indicating the reception intensity distribution along the Z-axis of the first representative coil 211, the peak position indicating the maximum value of the reception intensity of the first representative coil 211 may be determined as the Z-axis position P211 of the first representative coil 211. Similarly, in the profile data indicating the reception intensity distribution along the Z-axis of the second to fourth representative coils 221, 231, and 241, the respective peak positions may be determined as the Z-axis position P221 of the second representative coil 221, the Z-axis position P231 of the third representative coil 231, and the Z-axis position P241 of the fourth representative coil 241.

The respective positions of the plurality of representative coils along any one axis are detected in such a manner that the positional relationship between the two or more representative coils can be derived. For example, when the position of the magnetic field center is defined as 0 mm as shown in FIG. 6, the positions of each representative coil along the Z-axis may be detected as a position in the positive or negative direction relative to the magnetic field center, such as P211=−150 mm, P221=+50 mm, P231=−50 mm, and P241=+150 mm.

In the step ST40, the determination function F3 determines the disposition of the RF coil 200 relative to the table 51 on the basis of the detected positions of the respective representative coils.

Figure 7:
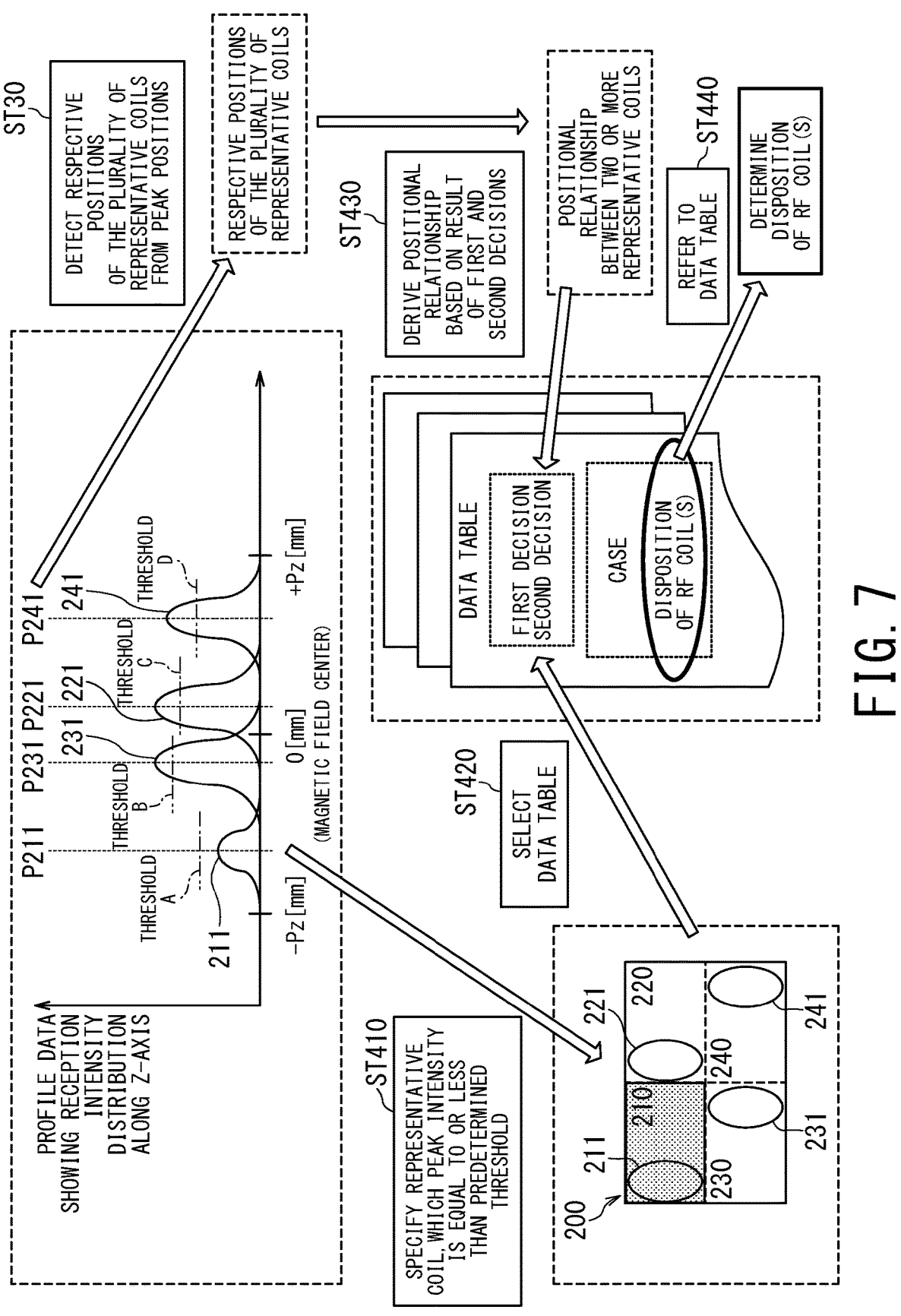
FIG. 7 is a schematic diagram illustrating determination of disposition of the RF coils relative to the table according to the embodiment.

FIG. 7 is a schematic diagram illustrating determination of the disposition of the RF coils 200 relative to the table 51 according to the embodiment. As shown in FIG. 7, the processing of the step ST40 can be achieved by the steps ST410, ST420, ST430, and ST440.

In the step ST410, based on the profile data that indicates the reception intensity distribution of the MR signal of each of the plurality of representative coils, the determination function F3 specifies at least one representative coil which peak intensity in the profile data is equal to or less than a predetermined threshold. The predetermined threshold is set for each of the plurality of representative coils. The predetermined threshold may be set for each of the coil elements that constitute the RF coil 200.

In FIG. 7, a threshold A is set as the predetermined threshold for the first representative coil 211. Similarly, a threshold B is set as the predetermined threshold for the third representative coil 231, a threshold C is set as the predetermined threshold for the second representative coil 221, and a threshold D is set as the predetermined threshold for the fourth representative coil 241, for example. Among the four representative coils including the first to fourth representative coils 211, 221, 231, and 241, only the peak intensity in the profile data indicating the reception intensity distribution of the MR signal of the first representative coil 211 is less than the predetermined threshold A. In this case, the first representative coil 211 is the representative coil of which profile data of has the peak intensity equal to or less than the predetermined threshold.

The determination function F3 may not apply the position of the representative coil having the peak intensity equal to or less than the predetermined threshold as shown in the profile data to the calculation for determining the disposition of the RF coil 200 relative to the table 51. When the peak intensity in the profile data of the representative coil is equal to or less than the predetermined threshold, the accuracy of the position of the representative coil to be detected on the basis of the profile data at a low SNR (Signal to Noise Ratio)

may decrease, and the representative coil itself may not be set within the imaging region of the object P. Thus, misrecognition of the position of the representative coil can be prevented by excluding such a representative coil having the peak intensity equal to or less than the predetermined threshold from the calculation.

On the other hand, in the selection of a data table for determining the disposition of the RF coil 200 relative to the table 51 in the step ST420 described below, the determination function F3 may determine the disposition of the RF coil 200 relative to the table 51 by reflecting the detection result indicating that the peak intensity in the profile data of the representative coil is equal to or less than the predetermined threshold.

In the step ST420, the determination function F3 selects and acquires the data table for determining the disposition of the RF coil 200 relative to the table 51. The data table is a table of data that associates the disposition of the RF coil 200 relative to the table 51 with the positional relationship between two or more representative coils. The data table is stored in the memory 41, for example.

The disposition of the RF coil 200 relative to the table 51 according to the embodiment will be described by referring to FIG. 8. The RF coil 200 can be installed in arbitrary orientation and can be installed with either its front surface or back surface brought into contact with the object P.

Figure 8:
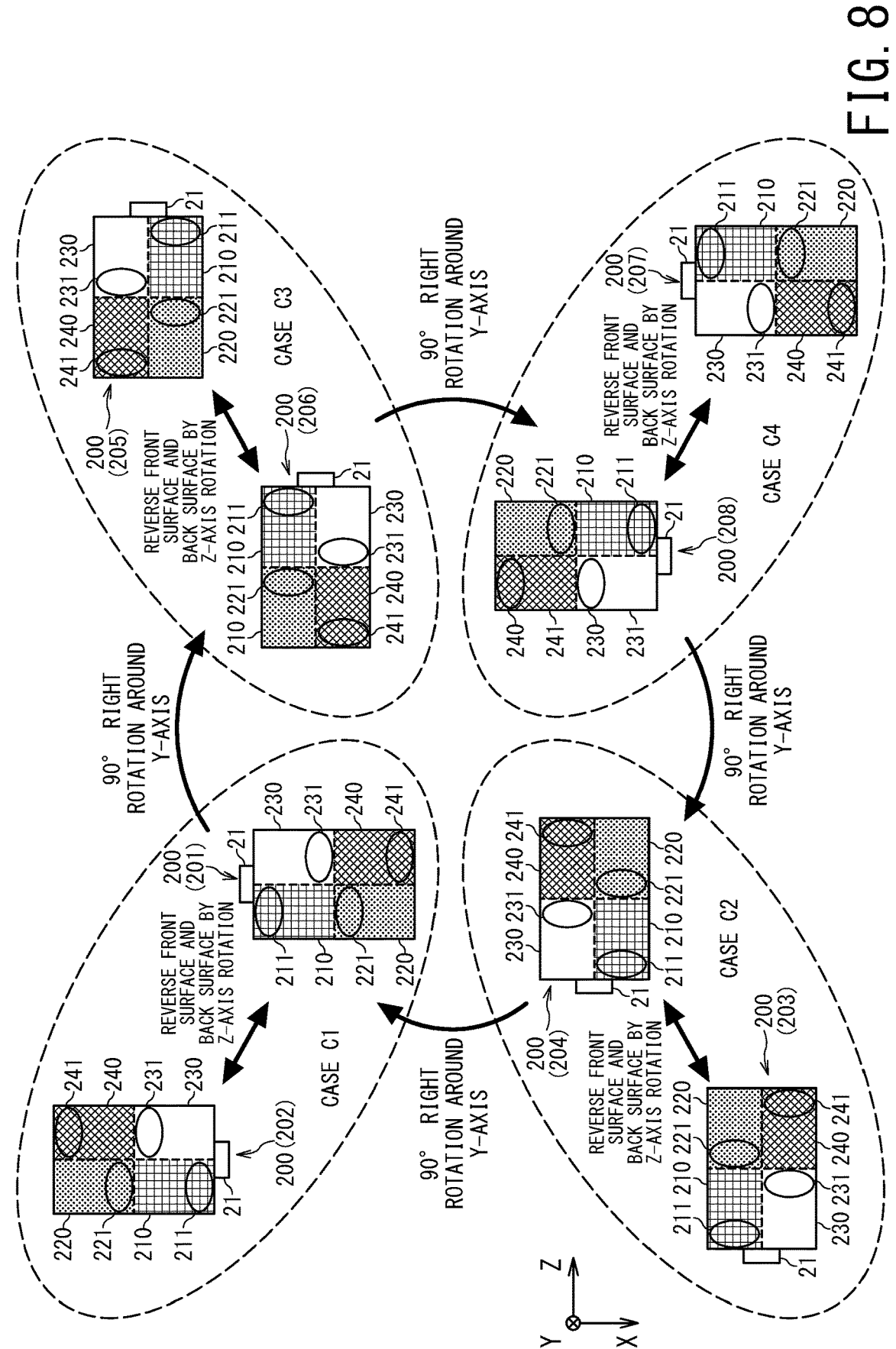
FIG. 8 is a schematic diagram illustrating disposition of the RF coils relative to the table according to the embodiment.

The central part of FIG. 8 illustrates the first disposition 201, the sixth disposition 206, the eighth disposition 208, and the fourth disposition 204 of the RF coils 200 disposed in four different orientations on the same plane (e.g., on the front surface). Rotating the RF coils 200 from the first disposition 201 to the right by 90° around the Y-axis results in the sixth disposition 206. Similarly, rotating the RF coils 200 from the sixth disposition 206, the eighth disposition 208, and the fourth disposition 204 to the right by 90° around the Y-axis result in the eighth disposition 208, the fourth disposition 204, and the first disposition 201, respectively.

Furthermore, in FIG. 8, for example, a combination of the RF coils 200 in the first disposition 201 and the second disposition 202 obtained by reversing the first disposition around the Z-axis is denoted as the case C1. Similarly, the case C2 indicates a combination of the fourth disposition 204 and the third disposition 203 that is obtained by reversing the fourth disposition 204 around the Z-axis. The case C3 indicates a combination of the sixth disposition 206 and the fifth disposition 205 that is obtained by reversing the sixth disposition 206 around the Z-axis. The case C4 indicates a combination of the eighth disposition 208 and the seventh disposition 207 that is obtained by reversing the eighth disposition 208 around the Z-axis. In this manner, two RF coils that are reversed around the one axis to be set as the reference axis in one-dimensional prescan may be deemed having the same disposition and treated as the same case in the determination of the disposition of the RF coils.

As shown in the first to eighth disposition patterns of the RF coil 200 in FIG. 8, the disposition of the RF coils 200 relative to the table 51 is defined by the combination of the front and back surfaces of the RF coil 200 and the orientation of the RF coil 200 relative to the table 51.

In the step ST420, in the selection of the data table for determining the disposition of the RF coils 200 relative to the table 51, the determination function F3 may determine the disposition of the RF coils 200 relative to the table 51 by further reflecting the event that the peak intensity in the profile data of a specific representative coil is equal to or less than the predetermined threshold. For example, the determination function F3 can select a data table DT2 from the data tables shown in FIG. 9 to FIG. 17 in consideration of the event that the peak intensity in the profile data of the first representative coil 211 is less than the predetermined threshold A as shown in FIG. 7.

In the step ST430, the determination function F3 derives the positional relationship between two or more representative coils from the detected positions of the plurality of representative coils, and one or more arithmetic expressions related to the selected data table may be applied to such deriving process.

In the step ST440, the determination function F3 determines the disposition of the RF coils 200 relative to the table 51 by referring to the data table and using the derived positional relationship between two or more representative coils.

Figure 9:
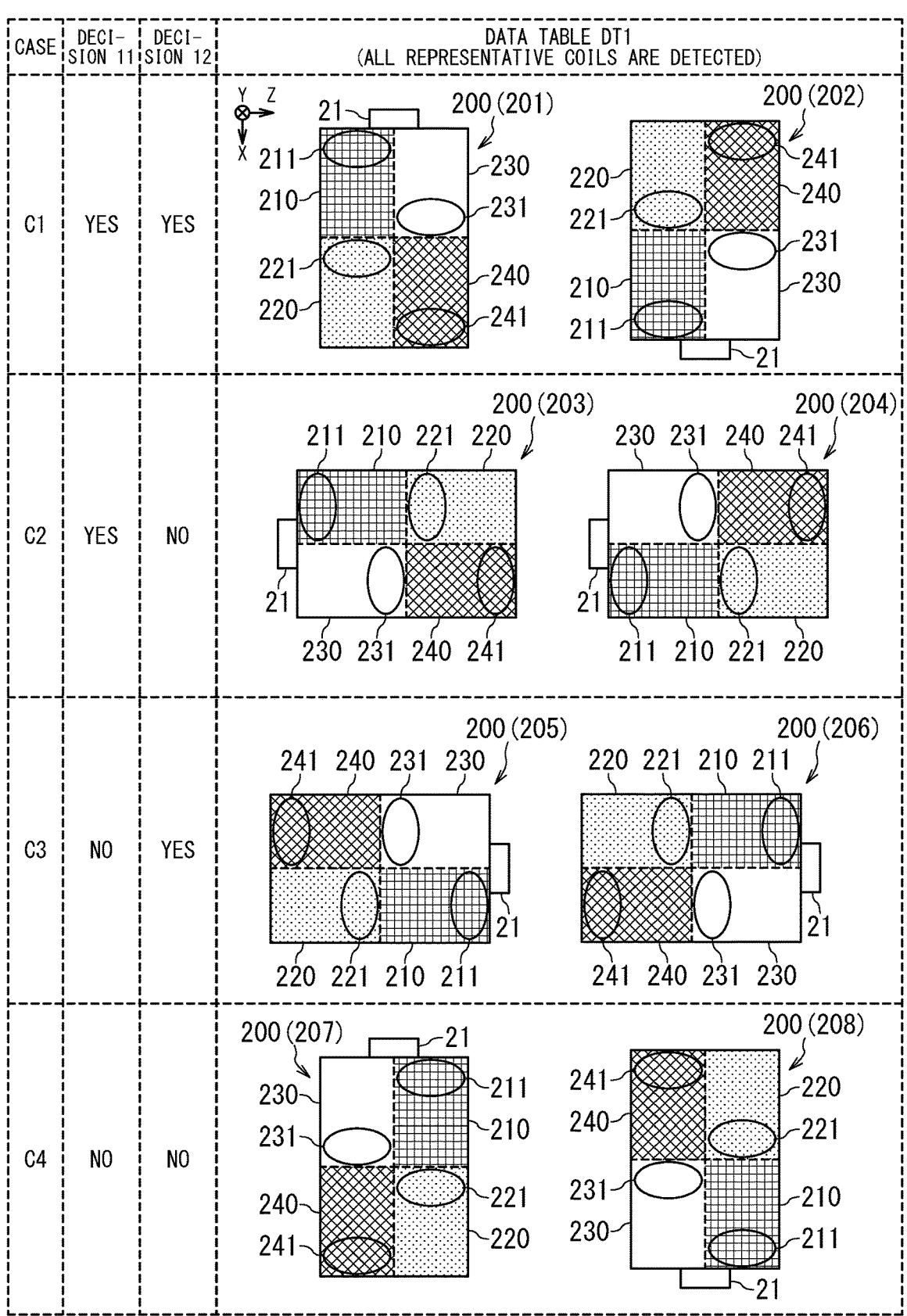
FIG. 9 is a schematic diagram illustrating the first aspect of the data table according to the embodiment.

FIG. 9 shows the data table DT1 when the peak intensities in the profile data of all the four representative coils are larger than the respective predetermined thresholds. Each of FIG. 10 to FIG. 17 shows a data table where the peak intensity in at least one profile data among the profile data of four representative coils is equal to or less than the predetermined threshold. In each of FIG. 10 to FIG. 17, any section including representative coil corresponding to the profile data below the predetermined threshold is denoted as a darker region (for example, the first section 210 in FIG. 10).

In the steps ST430 and ST440, arithmetic expressions for deciding the disposition pattern shown in the selected data table are applied, so as to derive the positional relationship between two or more representative coils from the position P211 of the first representative coil, the position P221 of the second representative coil, the position P231 of the third representative coil, and the position P241 of the fourth representative coil. The arithmetic expressions for the determination on the disposition pattern shown in the respective data tables are, for example, (Decision 11), (Decision 91) as described below. A decision is made on the basis of the derived positional relationship between the two or more representative coils. As shown in FIG. 9 to FIG. 17, if the arithmetic expressions for such decision are satisfied, the calculation result of YES is outputted. If the arithmetic expressions are not satisfied, the calculation result of NO is outputted. The output of the calculation result of YES and NO is defined as the decision. The disposition of the RF coils 200 relative to the table 51 is determined by referring to the selected data table and the decision. For example, the determination function F3 derives the positional relationship between two or more representative coils on the basis of the arithmetic operation such as subtraction of the values indicating the positions of the two representative coils and the combination of the arithmetic operation to be described below, and then determines the disposition of the RF coils 200 relative to the table 51.

In addition, the determination function F3 may determine the disposition of the RF coils 200 relative to the table 51 by deriving the positional relationship between two or more representative coils in the following manner. That is, as to the arithmetic operation where the values of the positions of the two representative coils are subtracted, if the absolute value of the arithmetic operation value is less than a predetermined threshold, it is derived that the two representative coils are present at almost the same position along any one axis. If the absolute value of the arithmetic operation value is equal to or larger than the predetermined threshold, it is derived that the two representative coils are present at positions indicated by the arithmetic operation value along any one axis. A detailed description is given below by referring to the data tables in FIG. 9 to FIG. 17.

FIG. 9 illustrates the data table DT1 showing a condition when all the representative coils are detected, and the disposition of the RF coils 200 relative to the table 51 in this case is determined on the basis of the decision 11 and the decision 12 as follows.

$$P211-P241 < 0 \qquad \text{(Decision 11)}$$

$$P221-P231 < 0 \qquad \text{(Decision 12)}$$

As shown in FIG. 9, if the decision 11 is YES and the decision 12 is YES, the disposition of the RF coils 200 is determined as the case C1. If the decision 11 is YES and the decision 12 is NO, the disposition of the RF coils 200 is determined as the case C2. If the decision 11 is NO and the decision 12 is YES, the disposition of the RF coils 200 is determined as the case C3. If the decision 11 is NO and the decision 12 is NO, the disposition of the RF coils 200 is determined as the case C4. The dispositions of the case C1 to the case C4 in FIG. 9 respectively correspond to the dispositions of the case C1 to the case C4 shown in FIG. 8. The same holds true for FIG. 10 to FIG. 17.

Figure 10:
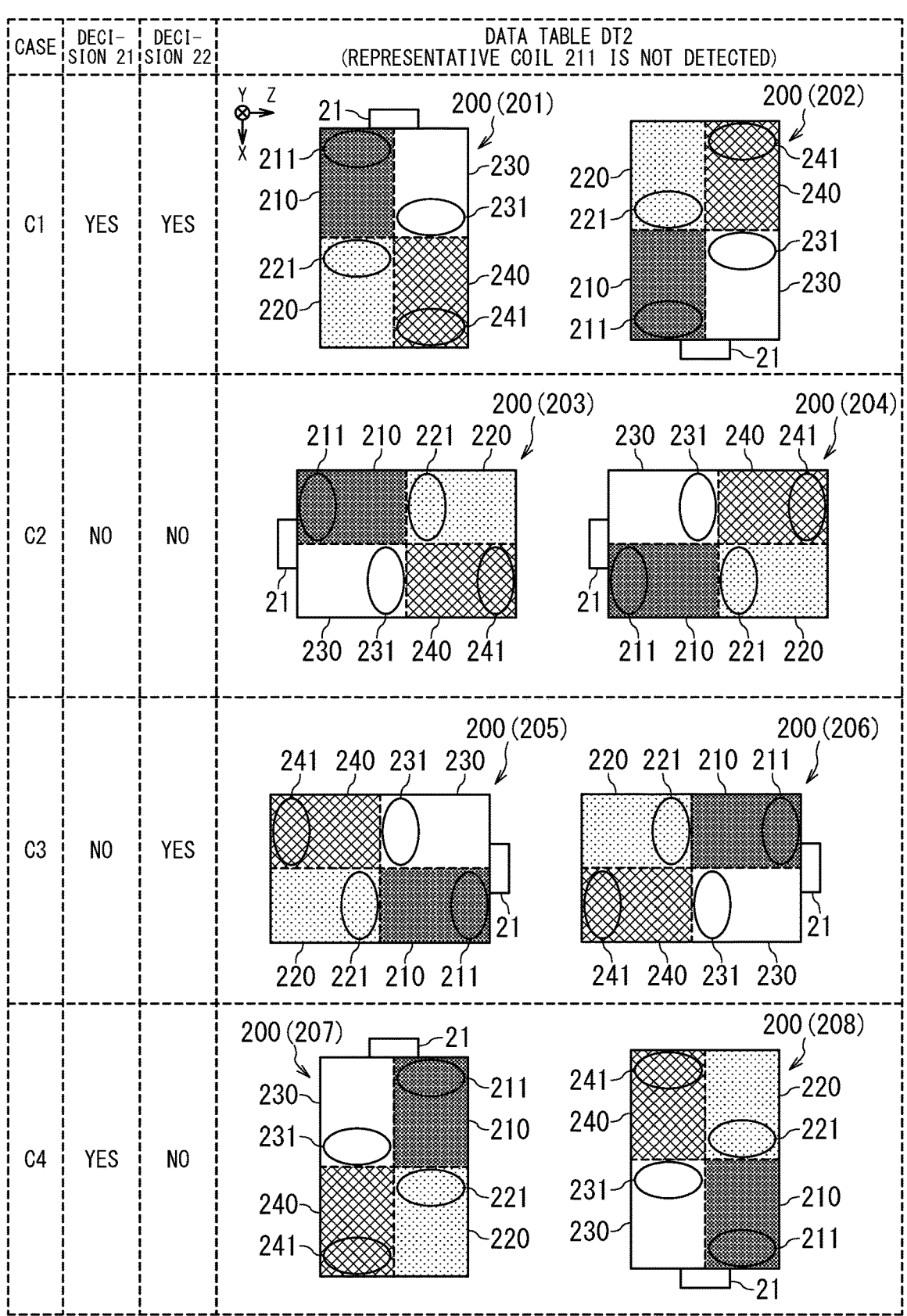
FIG. 10 is a schematic diagram illustrating the second aspect of the data table according to the embodiment.

FIG. 10 illustrates the data table DT2 showing a condition when only the first representative coil 211 is not detected while the other representative coils are detected, and the disposition of the RF coils 200 relative to the table 51 in this case is determined on the basis of the decision 21 and the decision 22 as follows.

$$|(P221-P241)| - |(P231-P241)| > 0 \qquad \text{(Decision 21)}$$

$$P221-P231 < 0 \qquad \text{(Decision 22)}$$

As shown in FIG. 10, if the decision 21 is YES and the decision 22 is YES, the disposition of the RF coils 200 is determined as the case C1. If the decision 21 is NO and the decision 22 is NO, the disposition of the RF coils 200 is determined as the case C2. If the decision 21 is NO and the decision 22 is YES, the disposition of the RF coils 200 is determined as the case C3. If the decision 21 is YES and the decision 22 is NO, the disposition of the RF coils 200 is determined as the case C4.

Figure 11:
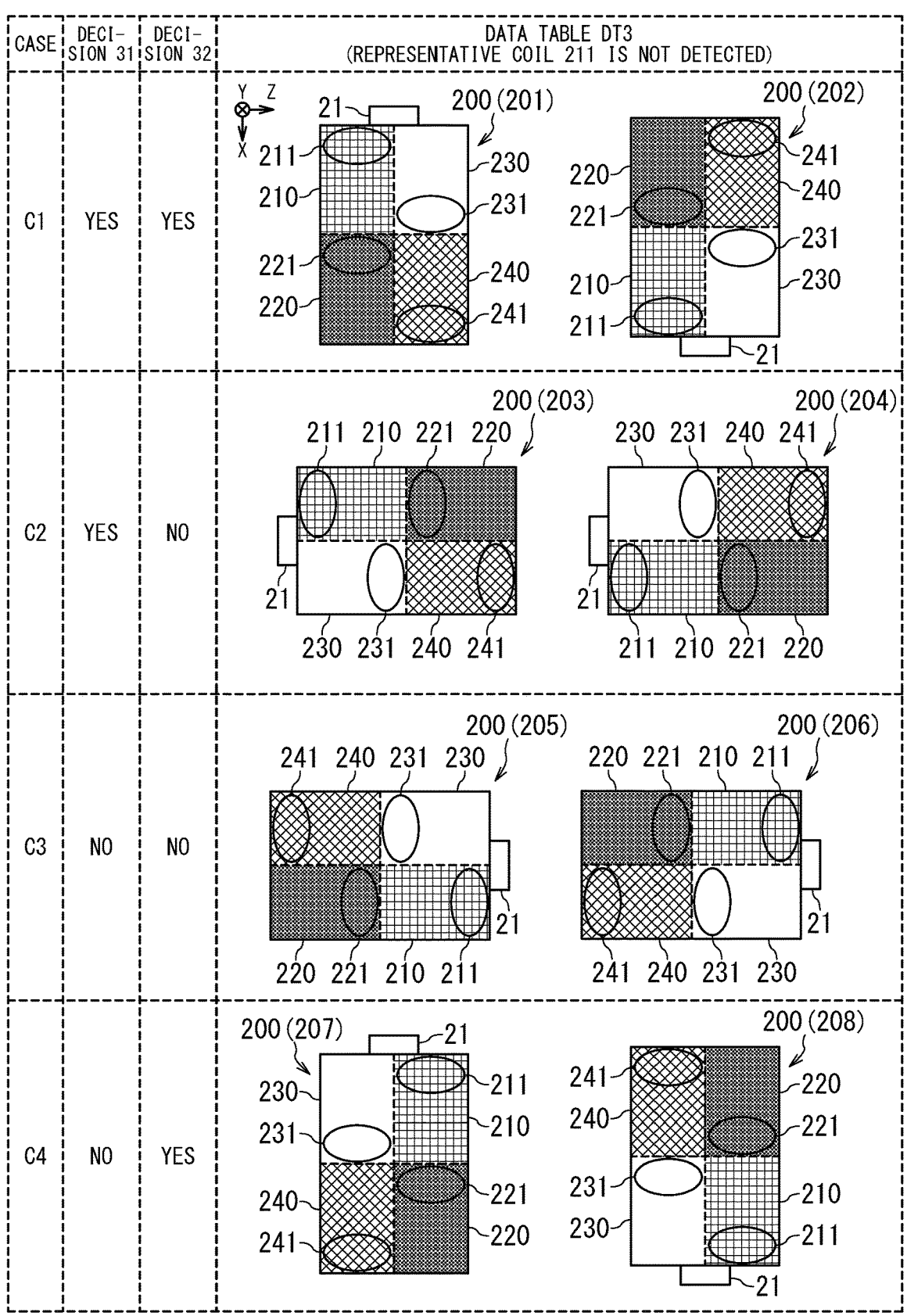
FIG. 11 is a schematic diagram illustrating the third aspect of the data table according to the embodiment.

FIG. 11 illustrates the data table DT3 showing a condition when only the second representative coil 221 is not detected while the other representative coils are detected, and the disposition of the RF coils 200 relative to the table 51 in this case is determined on the basis of the decision 31 and the decision 32 as follows.

$$P211-P241 < 0 \qquad \text{(Decision 31)}$$

$$|(P211-P231)| - |(P241-P231)| > 0 \qquad \text{(Decision 32)}$$

As shown in FIG. 11, if the decision 31 is YES and the decision 32 is YES, the disposition of the RF coils 200 is determined as the case C1. If the decision 31 is YES and the decision 32 is NO, the disposition of the RF coils 200 is determined as the case C2. If the decision 31 is NO and the decision 32 is NO, the disposition of the RF coils 200 is determined as the case C3. If the decision 31 is NO and the decision 32 is YES, the disposition of the RF coils 200 is determined as the case C4.

Figure 12:
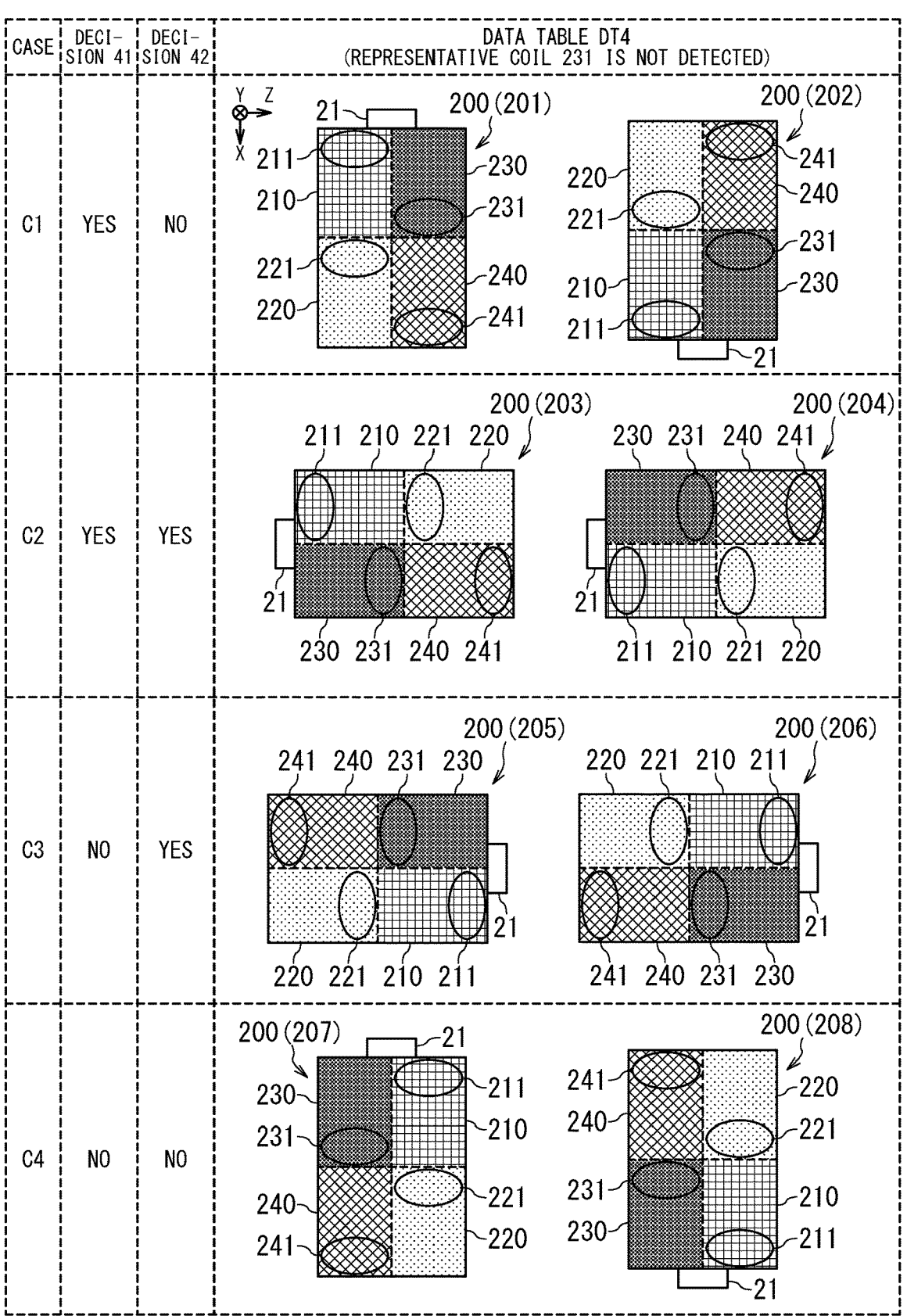
FIG. 12 is a schematic diagram illustrating the fourth aspect of the data table according to the embodiment.

FIG. 12 illustrates the data table DT4 showing a condition when only the third representative coil 231 is not detected while the other representative coils are detected, and the disposition of the RF coils 200 relative to the table 51 in this case is determined on the basis of the decision 41 and the decision 42 as follows.

$$P211-P241 < 0 \qquad \text{(Decision 41)}$$

$$|(P211-P221)| - |(P241-P221)| > 0 \qquad \text{(Decision 42)}$$

As shown in FIG. 12, if the decision 41 is YES and the decision 42 is NO, the disposition of the RF coils 200 is determined as the case C1. If the decision 41 is YES and the decision 42 is YES, the disposition of the RF coils 200 is determined as the case C2. If the decision 41 is NO and the decision 42 is YES, the disposition of the RF coils 200 is determined as the case C3. If the decision 41 is NO and the decision 42 is NO, the disposition of the RF coils 200 is determined as the case C4.

Figure 13:
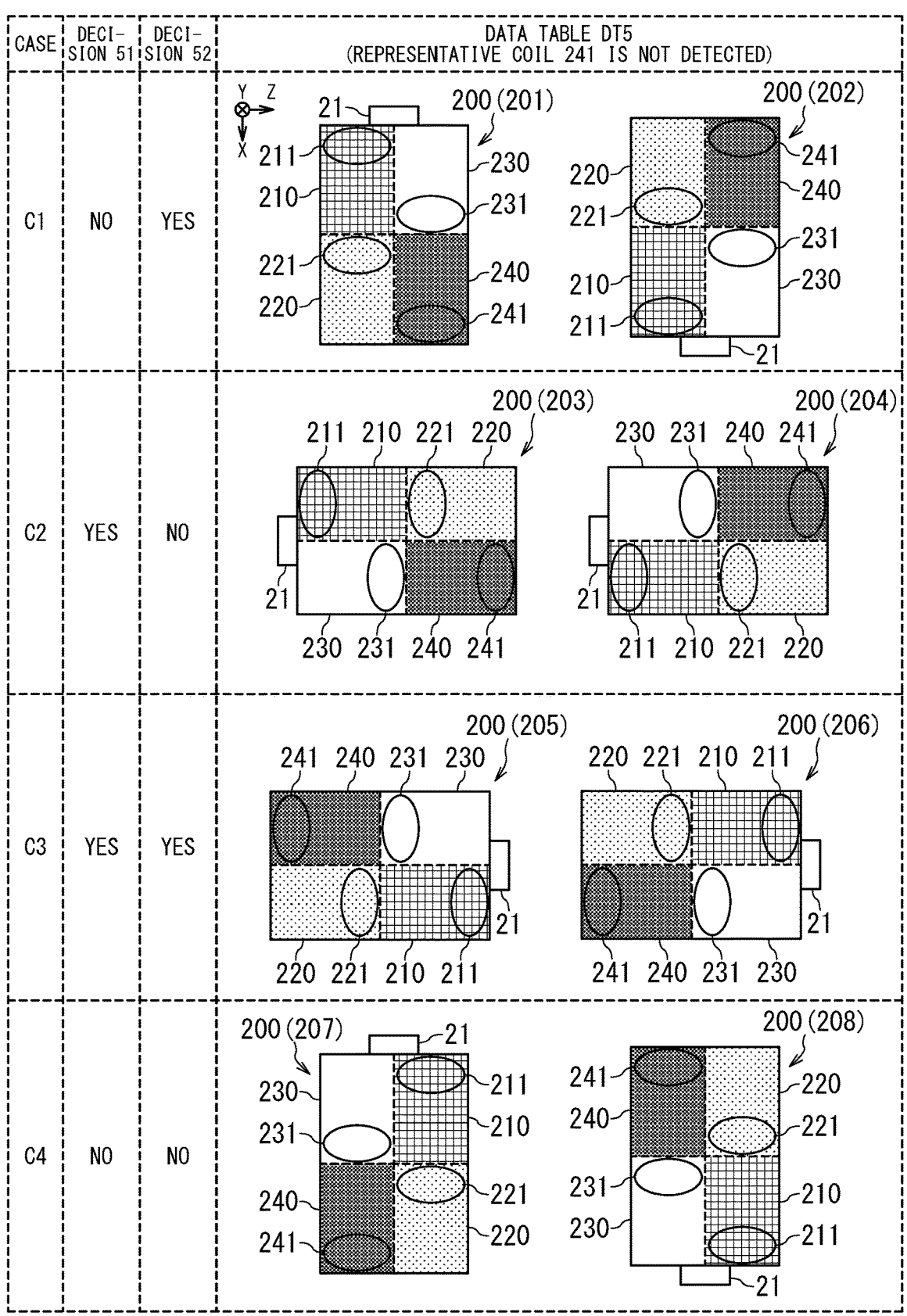
FIG. 13 is a schematic diagram illustrating the fifth aspect of the data table according to the embodiment.

FIG. 13 illustrates the data table DT5 showing a condition when only the fourth representative coil 241 is not detected while the other representative coils are detected, and the disposition of the RF coils 200 relative to the table 51 in this case is determined on the basis of the decision 51 and the decision 52 as follows.

$$|(P221-P211)| - |(P231-P211)| > 0 \qquad \text{(Decision 51)}$$

$$P221-P231 < 0 \qquad \text{(Decision 52)}$$

As shown in FIG. 13, if the decision 51 is NO and the decision 52 is YES, the disposition of the RF coils 200 is determined as the case C1. If the decision 51 is YES and the decision 52 is NO, the disposition of the RF coils 200 is determined as the case C2. If the decision 51 is YES and the decision 52 is YES, the disposition of the RF coils 200 is determined as the case C3. If the decision 51 is NO and the decision 52 is NO, the disposition of the RF coils 200 is determined as the case C4.

Figure 14:
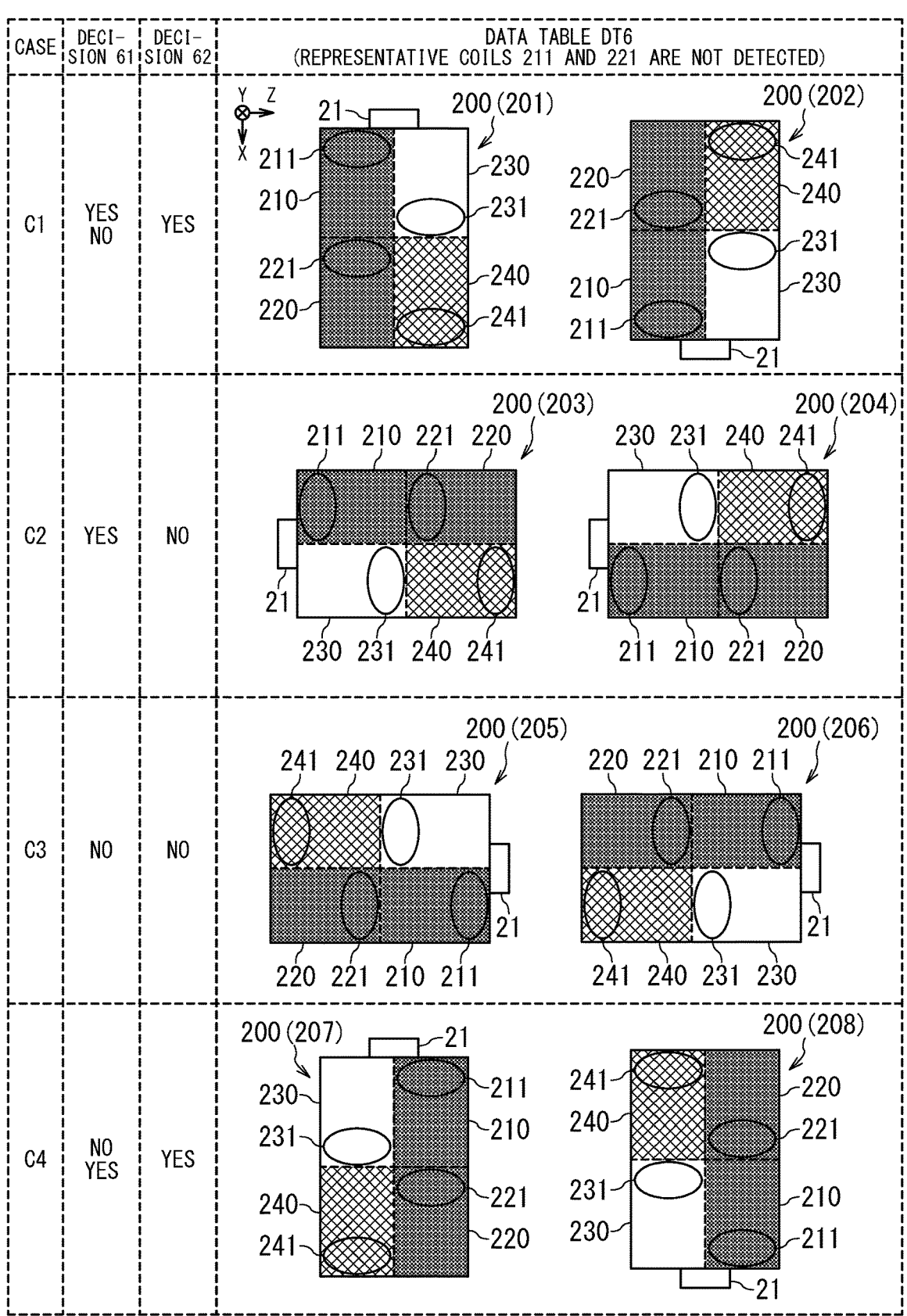
FIG. 14 is a schematic diagram illustrating the sixth aspect of the data table according to the embodiment.

FIG. 14 illustrates the data table DT6 showing a condition when the first representative coil 211 and the second representative coil 221 are not detected, and the disposition of the RF coils 200 relative to the table 51 in this case is determined on the basis of the decision 61 and the decision 62 as follows.

$$P231-P241 < 0 \qquad \text{(Decision 61)}$$

$$|(P231-P241)| < \alpha \qquad \text{(Decision 62)}$$

In the decision 62, a is a predetermined threshold set for each RF coil 200, and may be set according to the positional relationship between the representative coils, for example.

As shown in FIG. 14, if the decision 61 is YES and the decision 62 is NO, the disposition of the RF coils 200 is determined as the case C2. If the decision 61 is NO and the decision 62 is NO, the disposition of the RF coils 200 is determined as the case C3.

However, if the decision 62 is YES, no matter the decision 61 is YES or NO, it cannot be determined whether the disposition of the RF coils 200 is the case C1 or the case C4. For this reason, it may be presumed that the third and fourth representative coils 231 and 241 where the MR signals are detected are closer to the magnetic field center as compared with the first and second representative coils 211 and 221 where the MR signals are not detected.

Further, in the case where the third and fourth representative coils 231 and 241 are not detected, the determination can be made by (i) replacing the position P231 of the third representative coil with the position P211 of the first representative coil and (ii) replacing the position P241 of the fourth representative coil with the position P221 of the second representative coil in the decisions 61 and 62 of the data table DT6 that shows a condition of non-detection of the first and second representative coils 211 and 221.

FIG. 15 illustrates the data table DT7 showing a condition when the first representative coil 211 and the third representative coil 231 are not detected, and the disposition of the RF coils 200 relative to the table 51 in this case is determined on the basis of the decision 71 and the decision 72 as follows.

$$P221 - P241 < 0 \qquad \text{(Decision 71)}$$

$$|(P221 - P241)| < \beta \qquad \text{(Decision 72)}$$

In the decision 72, R is a predetermined threshold set for each RF coil 200, and may be set according to the positional relationship between representative coils, for example.

As shown in FIG. 15, if the decision 71 is YES and the decision 72 is YES, the disposition of the RF coils 200 is determined as the case C1. If the decision 71 is YES and the decision 72 is NO, the disposition of the RF coils 200 is determined as the case C2. If the decision 71 is NO and the decision 72 is NO, the disposition of the RF coils 200 is determined as the case C3. If the decision 71 is NO and the decision 72 is YES, the disposition of the RF coils 200 is determined as the case C4.

Further, in the case where the second and fourth representative coils 221 and 241 are not detected, the determination can be made by (i) replacing the position P221 of the second representative coil with the position P211 of the first representative coil and (ii) replacing the position P241 of the fourth representative coil with the position P231 of the third representative coil in the decisions 71 and 72 of the data table DT7 that shows a condition of non-detection of the first and third representative coils 211 and 231.

Figure 16:
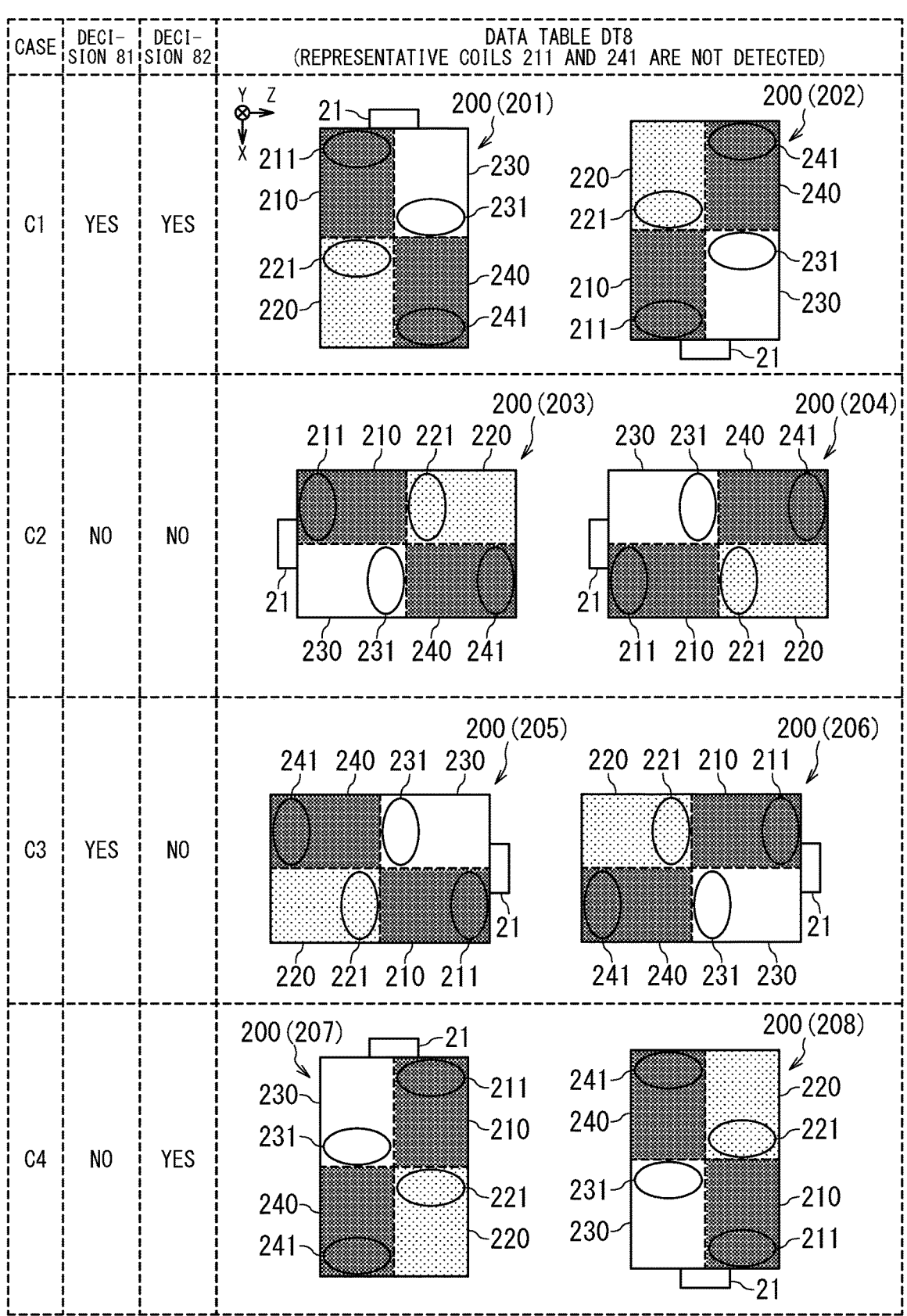
FIG. 16 is a schematic diagram illustrating the eighth aspect of the data table according to the embodiment.

FIG. 16 illustrates the data table DT8 showing a condition when the first representative coil 211 and the fourth representative coil 241 are not detected, and the disposition of the RF coils 200 relative to the table 51 in this case is determined on the basis of the decision 81 and the decision 82 as follows.

$$P221 - P231 < 0 \qquad \text{(Decision 81)}$$

$$|(P221 - P231)| < \gamma \qquad \text{(Decision 82)}$$

In the decision 82, y is a predetermined threshold set for each RF coil 200, and may be set according to the positional relationship between representative coils, for example.

As shown in FIG. 16, if the decision 81 is YES and the decision 82 is YES, the disposition of the RF coils 200 is determined as the case C1. If the decision 81 is NO and the decision 82 is NO, the disposition of the RF coils 200 is determined as the case C2. If the decision 81 is YES and the decision 82 is NO, the disposition of the RF coils 200 is determined as the case C3. If the decision 81 is NO and the decision 82 is YES, the disposition of the RF coils 200 is determined as the case C4.

Since the second representative coil 221 and the third representative coil 231 are located in the central portion of the RF coil 200, it is very unlikely that the situation where the first and fourth representative coils 211 and 241 are detected while the second and third representative coils 221 and 231 are not detected will occur. Accordingly, the MRI apparatus 1 may notify the user of an error without performing the determination.

Figure 17:
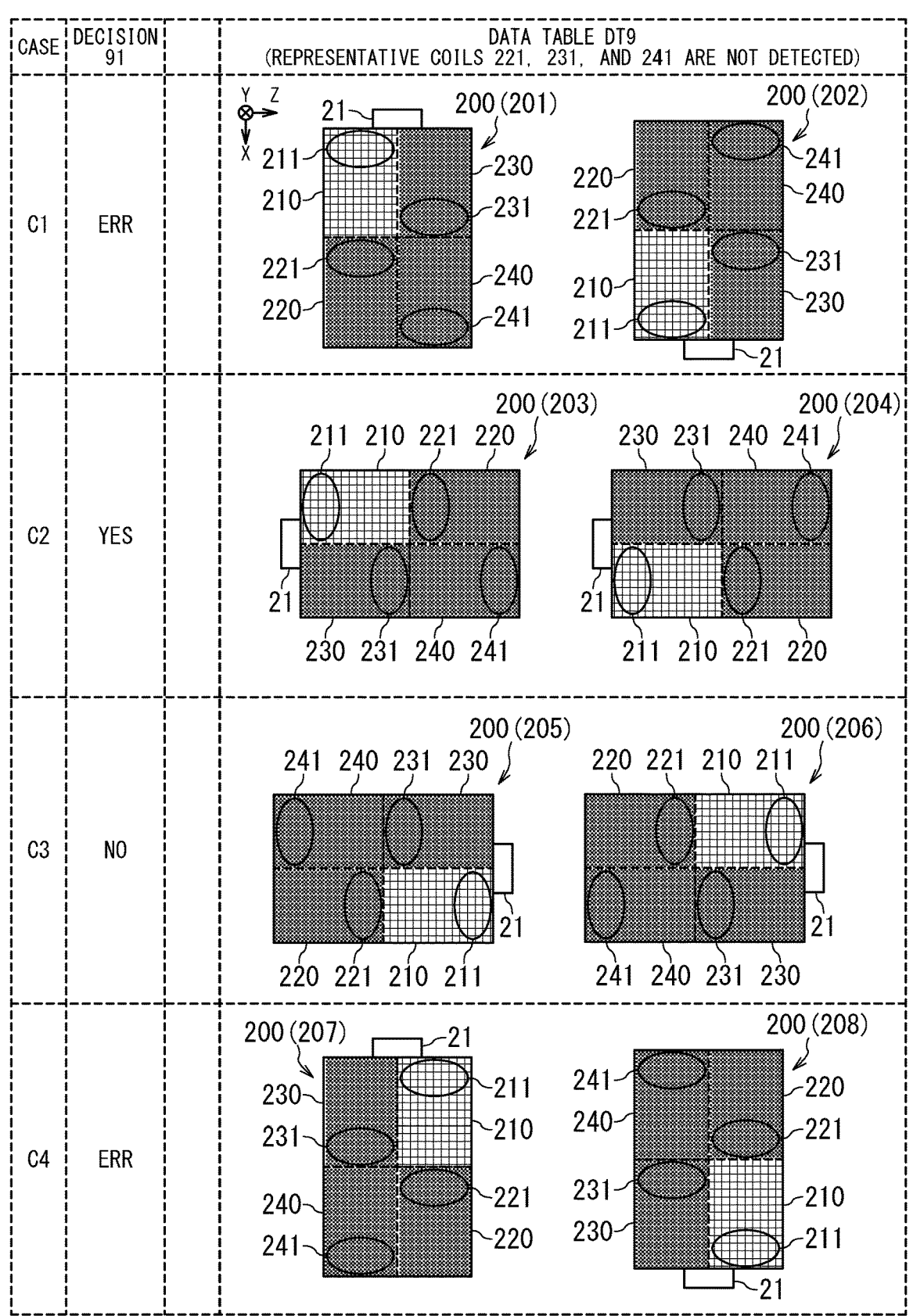
FIG. 17 is a schematic diagram illustrating the ninth aspect of the data table according to the embodiment.

FIG. 17 illustrates the data table DT9 showing a condition when three representative coils among the four representative coils are not detected, as exemplified by a case where the second representative coil 221, the third representative coil 231, and the fourth representative coil 241 are not detected. In this case, only the first representative coil 211 is detected, and thus, the positional relationship between two or more representative coils is not computed in the decision 91.

In this case, when the MR signal of the first representative coil 211 is detected but the respective MR signals of the second, third, and fourth representative coils 221, 231, and 241 are not detected, it may be presumed in the decision 91 that the first representative coil 211 where the MR signal is detected is located closer to the magnetic field center as compared with the second, third, and fourth representative coils 221, 231, and 241 where the MR signals are not detected.

Further, in the cases C1 and C3 where the first representative coil 211 and the second representative coil 221 are supposed to be at almost the same position along the Z-axis known by using an optical camera 8 in combination as described below, a situation where the MR signal of the second representative coil 221 is not detected but the MR signal of the first representative coil 211 is detected may be determined to be inappropriate, and the MRI apparatus 1 may notify the user of error in such a situation.

When the MR signal of the fourth representative coil 241 is detected and the respective MR signals of the first to third representative coils 211, 221, and 231 are not detected, it may be presumed that the fourth representative coil 241 where the MR signal is detected is located closer to the magnetic field center as compared with the first to third representative coils 211, 221, and 231 where the MR signals are not detected.

Since the second representative coil 221 or the third representative coil 231 is located in the central portion of the RF coil 200, it is very unlikely that the situation where only one of the second representative coil 221 and the third representative coil 231 is not detected will occur. Accordingly, the MRI apparatus 1 may notify the user of an error without performing the determination.

In the prescan, though a description has been given of the case where the MR signals for generating the profile data is one-dimensionally acquired along any one axis, such as Z-axis, the MR signals for generating the profile data may be acquired along any one axis, any two axes, or any three axes. For example, in the case of plural axes, the MR signals are acquired along each of the plural axes. When the respective positions of the plurality of representative coils are detected along not only one axis but plural axes based on the acquired MR signals, more information on the positions of the representative coils are obtained, which enables more accurate determination of the disposition of the RF coils.

For example, in FIG. 6, the profile date indicating reception intensity distribution of the MR signals is two-dimensionally generated along the Z-axis and the X-axis. The position P211' of the first representative coil, the position P221' of the second representative coil, the position P231' of the third representative coil, and the position P241' of the fourth representative coil are detected along the X-axis. In such a manner, when the profile date indicating reception intensity distribution of the MR signal is two-dimensionally generated along any one axis and another axis orthogonal thereto such as a combination of the Z-axis and the X-axis, the dispositions of two RF coils being reversed to each other around any one axis, which was one-dimensionally deemed as having the same disposition as the same case, can be distinguished from each other as RF coils having different dispositions.

The MRI apparatus 1 may be configured in such a manner that (i) the acquisition function F1 generates a profile data indicating reception intensity distribution of the MR signals along the first axis as any one axis and the second axis orthogonal to the first axis, (ii) the detection function F2 detects the respective positions of the plurality of representative coils along the first and second axes on the basis of the generated profile data, and (iii) the determination function F3 determines the disposition of the RF coils relative to the table 51 on the basis of the positions of the plurality of representative coils detected along the first and second axes.

As described above, in the step ST40, the determination function F3 determines the disposition of the RF coils 200 relative to the table 51 on the basis of the respective detected positions of the plurality of representative coils. Further, the determination function F3 may determine whether the determined disposition of the RF coils 200 relative to the table 51 matches the specific disposition of the RF coils 200 to be used in the diagnostic scan or not.

The specific disposition of the RF coils 200 to be used in the diagnostic scan is the disposition of the RF coils 200 suitable for examination, which is determined by the processing circuitry 40 on the basis of various information such as information on the anatomical imaging part, the imaging conditions, and the type of the RF coils 200, for example.

The MRI apparatus 1 may notify the user whether the determined disposition of the RF coils 200 relative to the table 51 matches the specific disposition of the RF coils 200 to be used in the diagnostic scan or not.

In addition, if the determined disposition of the RF coils 200 relative to the table 51 does not match the specific disposition of the RF coils 200 to be used in the diagnostic scan, the MRI apparatus 1 may confirm if the user prefers to reset the RF coils 200. In this case, if the user prefers not to reset, the processing proceeds to the step ST50. If the user prefers to reset, the processing returns to the step ST10.

In the step ST50, the display control function F4 causes the display 42 to display the selection support information enabling the user to select the coil elements in the RF coils 200 on the basis of the determined disposition of the RF coils 200 relative to the table 51. The selection support information may include information on at least one coil element, which is to be used for the diagnostic scan and is determined on the basis of information on the anatomical imaging part and imaging conditions from the plurality of coil elements provided in the RF coils 200. The information on the coil elements to be used for the diagnostic scan may be information on the section and/or group that includes the coil element(s) to be used as determined by the processing circuitry 40, for example.

The display control function F4 may distinguishably display the section(s) and group(s) containing the coil element(s) to be used on the display 42 by, for example, highlighting them in such a manner that the user can readily select the desired coil element(s).

In addition, the MRI apparatus 1 may display a request for a permission from the user in advance such that the coil elements determined to be used for the diagnostic scan will be actually used for the diagnostic scan.

Figure 18:
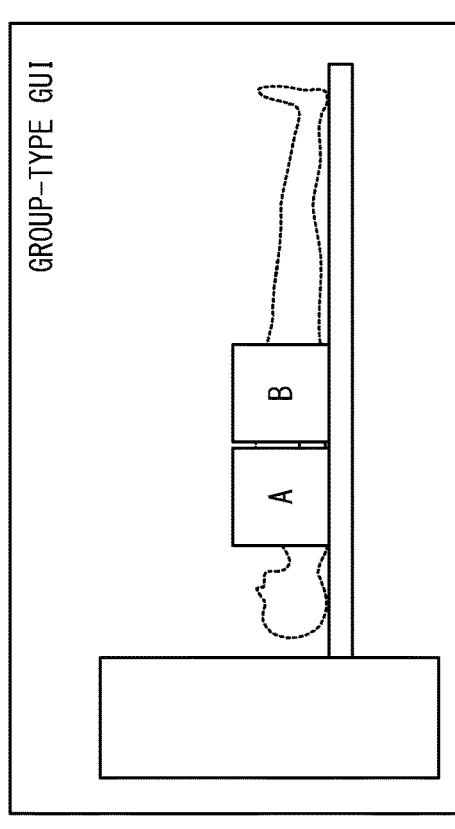
FIG. 18 is a schematic diagram illustrating the first disposition aspect of the RF coils and display of selection support information according to the embodiment.
Figure 18:
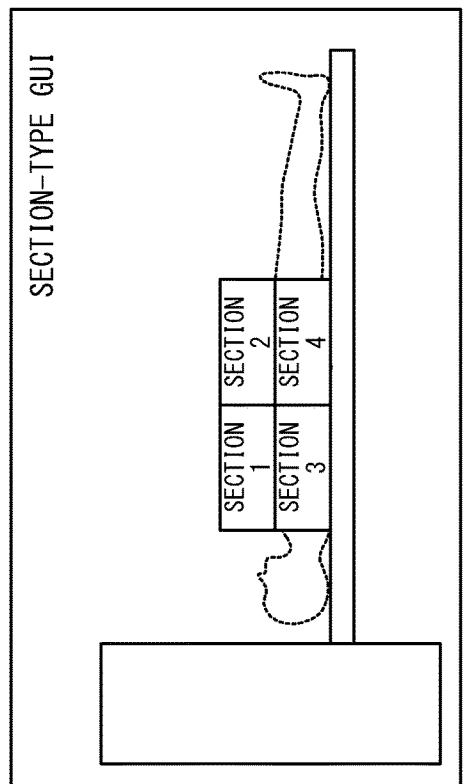
Figure 18:
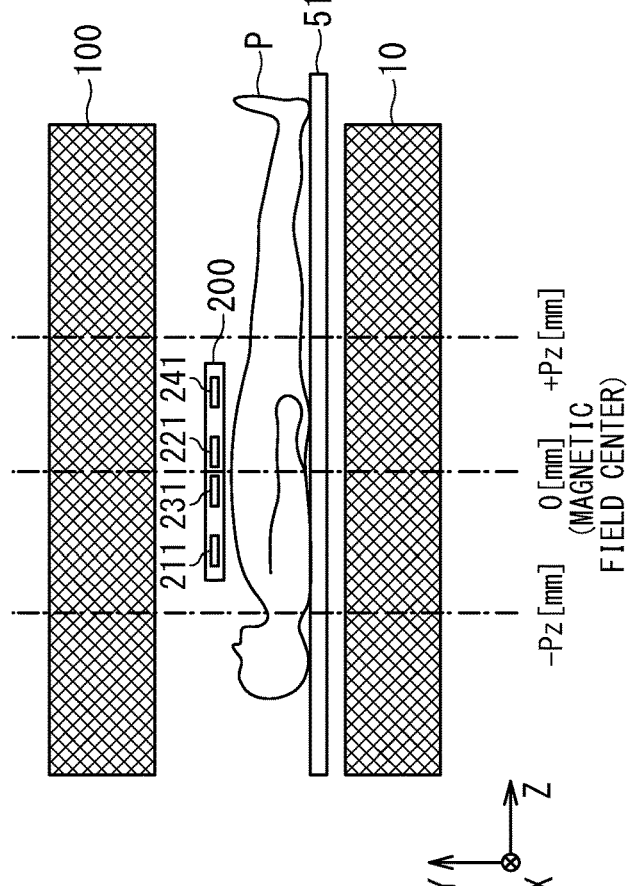

FIG. 18 is a schematic diagram illustrating the disposition of the RF coils according to the embodiment and a GUI (Graphical User Interface) display as a display aspect of the selection support information. For example, there are two types of GUI display: a section-type GUI and a group-type GUI.

In the display aspect of the section-type GUI shown in the lower right part of FIG. 18, section division figures section1, section2, section3, and section4 indicate the first section 210, the second section 220, the third section 230, and the fourth section 240 respectively. The positional relationship between the first section 210, the second section 220, third section 230, and the fourth section 240 can be determined or distinguished by the section division figures. In this manner, the selection support information may be a section division figure by which the positional relationship between the plurality of sections in the RF coil 200 relative to the table 51 can be determined or distinguished.

In the display aspect of the group-type GUI shown in the upper right part of FIG. 18, the selection support information may be the group division figures A and B, which are configured in such a manner that the positional relationship between the plurality of groups relative to the table 51 can be distinguished by dividing the RF coils 200 in the longitudinal direction of the table 51 into a plurality of regions. In the display aspect of the group-type GUI shown in the upper right part of FIG. 18, the group division figure A is composed of the two sections labeled as the section division figures section1 and section3, and the group division figure B is composed of the two sections labeled as the section division figures section2 and the section4. The group division figures may also be group division figures that divide the table 51 into a plurality of regions in the direction orthogonal to its longitudinal direction depending on the configuration of the sections constituting the group division figures, for example.

Furthermore, as the selection support information, in addition to at least one of the section division figures and the group division figures, other information assisting the user in selecting the coil elements in the RF coil 200 may be displayed, such as the position of the object P and the position from the magnetic field center.

In the step ST60, the coil-element selection function F5 selects the coil elements to be used for the diagnostic scan from the plurality of coil elements provided in the RF coils 200. The selection of the coil elements to be used for the diagnostic scan is performed by user's input operation via the display 42 provided with a GUI, for example. Both information on the coil elements that should be used for the diagnostic scan and the information on the section(s) and/or group(s) containing the coil elements that should be used, which are specified in advance as the selection support information, may be applied in the selection of the coil elements to be actually used for the diagnostic scan. In this case, for example, the user may simply give permission of the selection as specified or may take the specified information into consideration and then select the coil element(s) to be used for the diagnostic scan.

When the selection support information is the section-type GUI, from the plurality of coil elements provided in the RF coils 200, the coil-element selection function F5 selects the coil elements belonging to one or plural sections specified by the section division figure(s) as the coil elements to be used for diagnostic scan.

When the selection support information is the group-type GUI, from the plurality of coil elements provided in the RF coils 200, the coil-element selection function F5 selects the coil elements belonging to one or plural groups specified by the group division figure(s) as the coil elements to be used for diagnostic scan.

As long as the coil elements are selected by using the selection support information, even if the number of channels that can be inputted to the RF receiver 32 is limited, the coil elements to be used for the diagnostic scan can be appropriately selected in the above-describe manner. For example, when the number of channels of all the coil elements constituting each of the plurality of RF coils including at least one RF coil 200 is large, the coil elements to be used for the diagnostic scan can be selected according to the number of channels that can be inputted to the RF receiver 32.

According to the MRI apparatus 1 of the first embodiment, in the RF coil 200 that can be installed in an arbitrary orientation with either its front surface or back surface brought into contact with the object P, the disposition of the RF coil 200 relative to the table 51 can be appropriately determined. Hereinafter, a description will be given of the determination results of several disposition aspects of the RF coils 200 relative to the table 51 in the MRI apparatus 1 according to the first embodiment where the Z-axis is the one axis and the Z-axis position of each representative coil is one-dimensionally detected using specific numerical values representing the positions of the representative coils.

(First Disposition Aspect)

In the first disposition aspect, one RF coil 200 is disposed on the object P in such a manner that the X-axis and Z-axis are approximately parallel to the first direction and the second direction of the RF coil 200, respectively. Although only one case as the first disposition aspect will be described below, the same procedure can be used for other cases of the first disposition aspect to determine the disposition of the RF coil 200 relative to the table 51.

As shown in FIG. 18, the respective Z-axis positions P211, P221, P231, and P241 of the first to fourth representative coils are detected as P211=−150 mm, P221=+50 mm, P231=−50 mm, and P241=+150 mm by assuming the magnetic field center being the reference position (Z=0 mm), for example. When all the representative coils are detected, the data table DT1 is selected, and the positional relationship between two or more representative coils is derived on the basis of the calculation of the decision 11 and the decision 12 of the data table DT1. The calculation results of the decision 11 and the decision 12 are as follows.

$$P211-P241 = -300 \text{ mm}$$

$$P221-P231 = +100 \text{ mm.}$$

Hence, referring to the data table DT1, the decision 11 is YES and the decision 12 is NO. Consequently, the disposition of the RF coil 200 is determined to be the case C2.

(Second Disposition Aspect)

Figure 19:
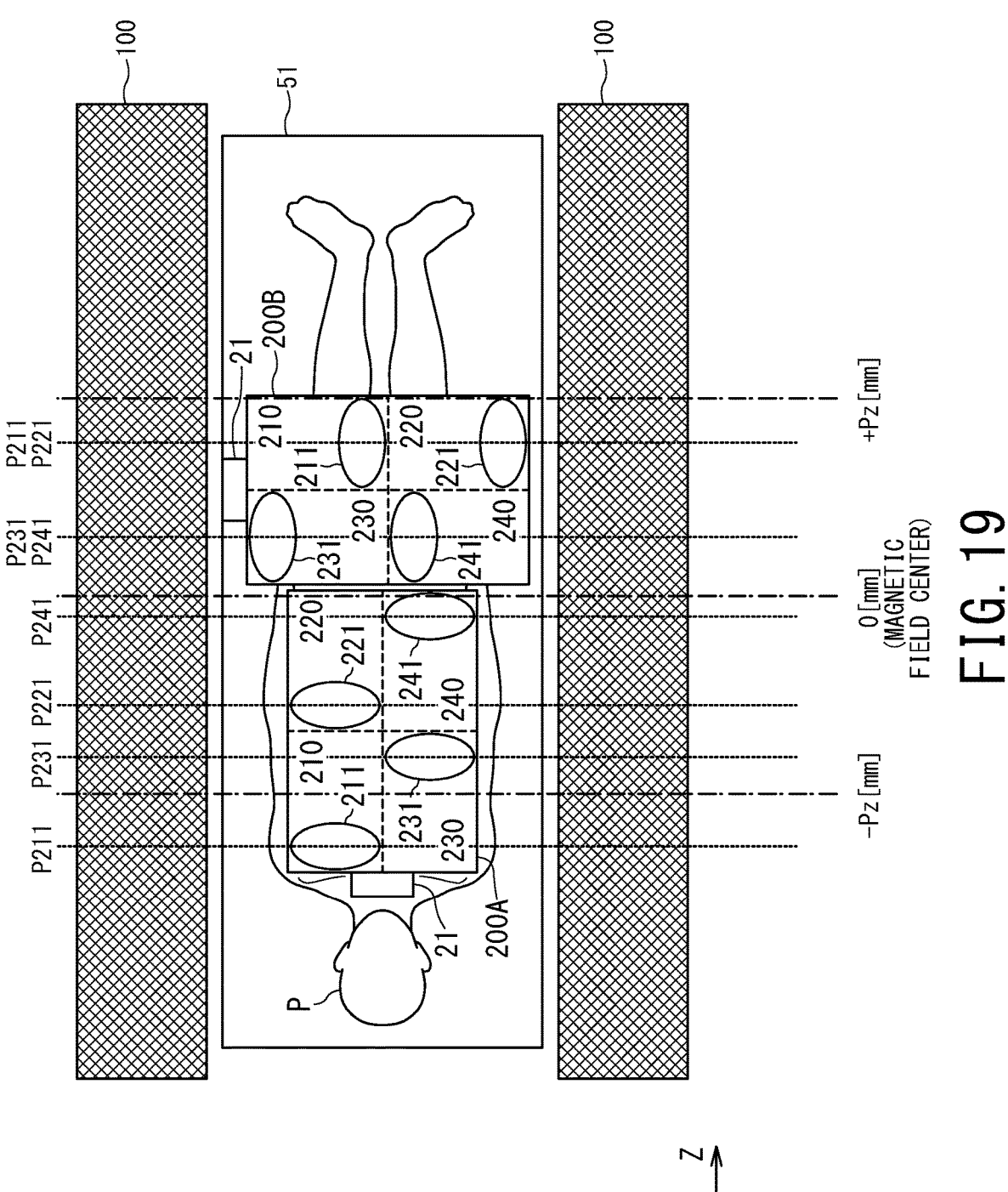
FIG. 19 is a schematic diagram illustrating the second disposition aspect of the RF coils.

FIG. 19 is a schematic diagram illustrating the second disposition aspect of the RF coils 200A and 200B, which are structurally and functionally equivalent to each other, but are given different reference signs for distinguishing the differences in disposition. In the second disposition aspect as shown in FIG. 19, two RF coils 200A and 200B are disposed on the object P. Although only one case as the second disposition aspect will be described below, the same procedure can be used for other cases of the second disposition aspect to determine the disposition of the RF coils 200 relative to the table 51.

As shown in FIG. 19, assuming that the magnetic field center is the reference position (Z=0 mm), and only the MR signal of the first representative coil 211 of the RF coil 200A is not detected while the respective Z-axis positions P221, P231, and P241 of the second to fourth representative coils are detected as P221=−150 mm, P231=−250 mm, and P241=−50 mm. Under this assumption, the data table DT2 is selected for determining the disposition of the RF coil 200A, and the positional relationship between two or more representative coils is derived on the basis of the calculation of the decision 21 and the decision 22 of the data table DT2. The calculation results of the decision 21 and the decision 22 are as follows.

$$\left|(P221-P241)\right| - \left|(P231-P241)\right| = -100 \text{ mm}$$

$$P221-P231 = +100 \text{ mm}$$

Thus, referring to the data table DT2, the decision 21 is NO and the decision 22 is NO, and consequently, the disposition of the RF coil 200A is determined to be the case C2.

In FIG. 19, assuming that the MR signals of all the representative coils of the RF coil 200B are detected, and the respective Z-axis positions P211, P221, P231, and P241 of the first to fourth representative coils are detected as P211=+150 mm, P221=+150 mm, P231=+50 mm, and P241=+50 mm. Under this assumption, the data table DT1 is selected for determining the disposition of the RF coil 200B, and the positional relationship between two or more representative coils is derived on the basis of the calculation of the decision 11 and the decision 12 of the data table DT1. The calculation results of the decision 11 and the decision 12 are as follows.

$$P211-P241 = +100 \text{ mm}$$

$$P221-P231 = +100 \text{ mm}$$

Thus, referring to the data table DT1, the decision 11 is YES and the decision 12 is YES, and consequently, the disposition of the RF coil 200B is determined to be the case C1.

When two RF coils 200A and 200B are disposed on the object P, it is very unlikely that the situation where the MR signal of the representative coils between the RF coil 200A and the RF coil 200B being not detected will occur. Since the MR signal of the first representative coil 211 is not detected but the MR signal of the second representative coil 221 is detected in the RF coil 200A, it may be determined that the disposition is the case C1 in which the first representative coil 211 is located farther from the magnetic field center as compared with the second representative coil 221.

As described above, even if two or more RF coils 200 are disposed on the object P as in the second disposition aspect, the disposition of each of the RF coils 200 relative to the table 51 can be determined by calculation using the arithmetic expressions (decisions) for each of the RF coils 200.

Figure 20:
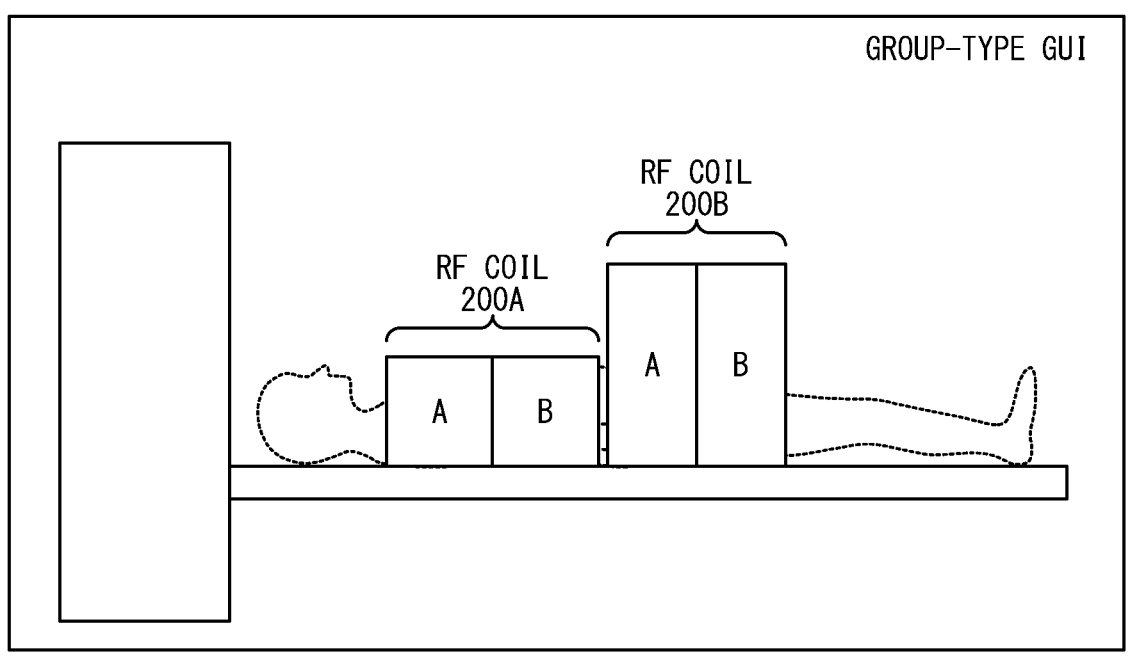
FIG. 20 is a schematic diagram illustrating a display aspect of the selection support information according to the second disposition aspect.
Figure 20:
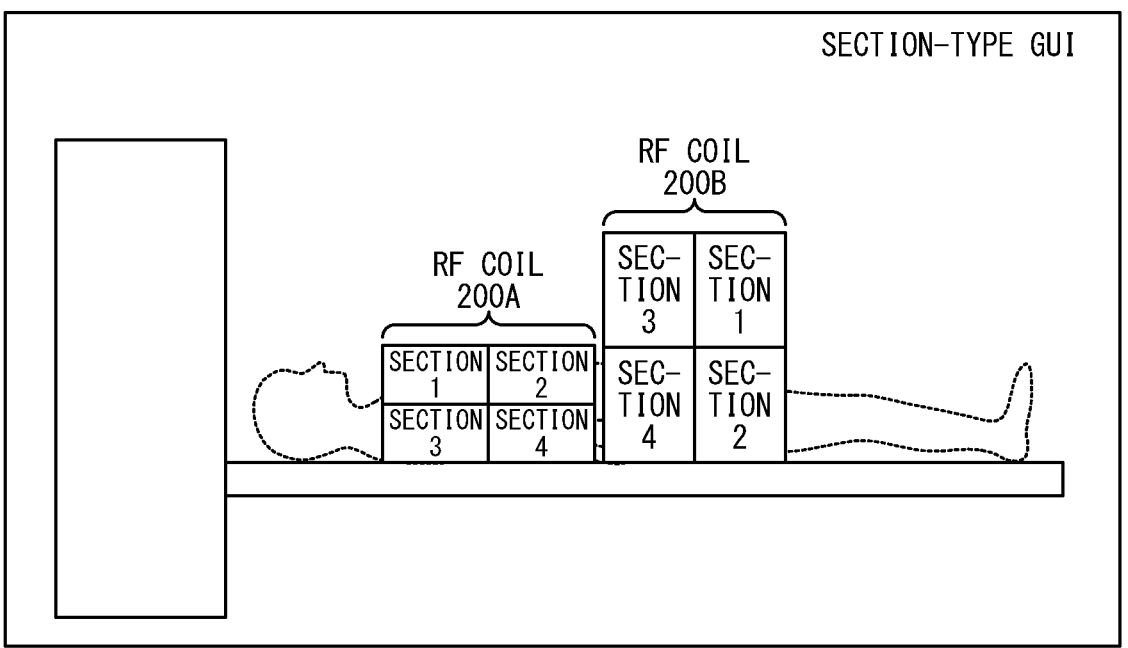

FIG. 20 is a schematic diagram illustrating a display aspect of the selection support information according to the second disposition aspect. In the display aspect of the section-type GUI shown in the lower part of FIG. 20, the positional relationship between the first section 210, the second section 220, the third section 230, and the fourth section 240 can be distinguished by the section division figures labeled as section1, section2, section3, and section4 for each of the RF coils 200A and 200B.

In the display aspect of the group-type GUI shown in the upper part of FIG. 20, regarding the RF coil 200A, the group division figure A is composed of two sections of section1 and section3, and the group division figure B is composed of two sections of section2 and section4. Regarding the RF coil 200B, the group division figure A is composed of two sections of section3 and section4, and the group division figure B is composed of two sections of section1 and section2.

In this manner, the disposition of the RF coils 200 can be distinguishably displayed such that the positional relationship between the plurality of RF coils 200 relative to the table 51 can be determined. In addition, the group division figures A and B displayed in the group-type GUI may be composed of different sections for each RF coil. Further, the difference in disposition relative to the table 51 between one RF coil 200A and the other RF coil 200B may be distinguishably displayed by the difference in length in the first and second directions between one RF coil 200A and the other RF coil 200B.

(Third Disposition Aspect)

Figure 21:
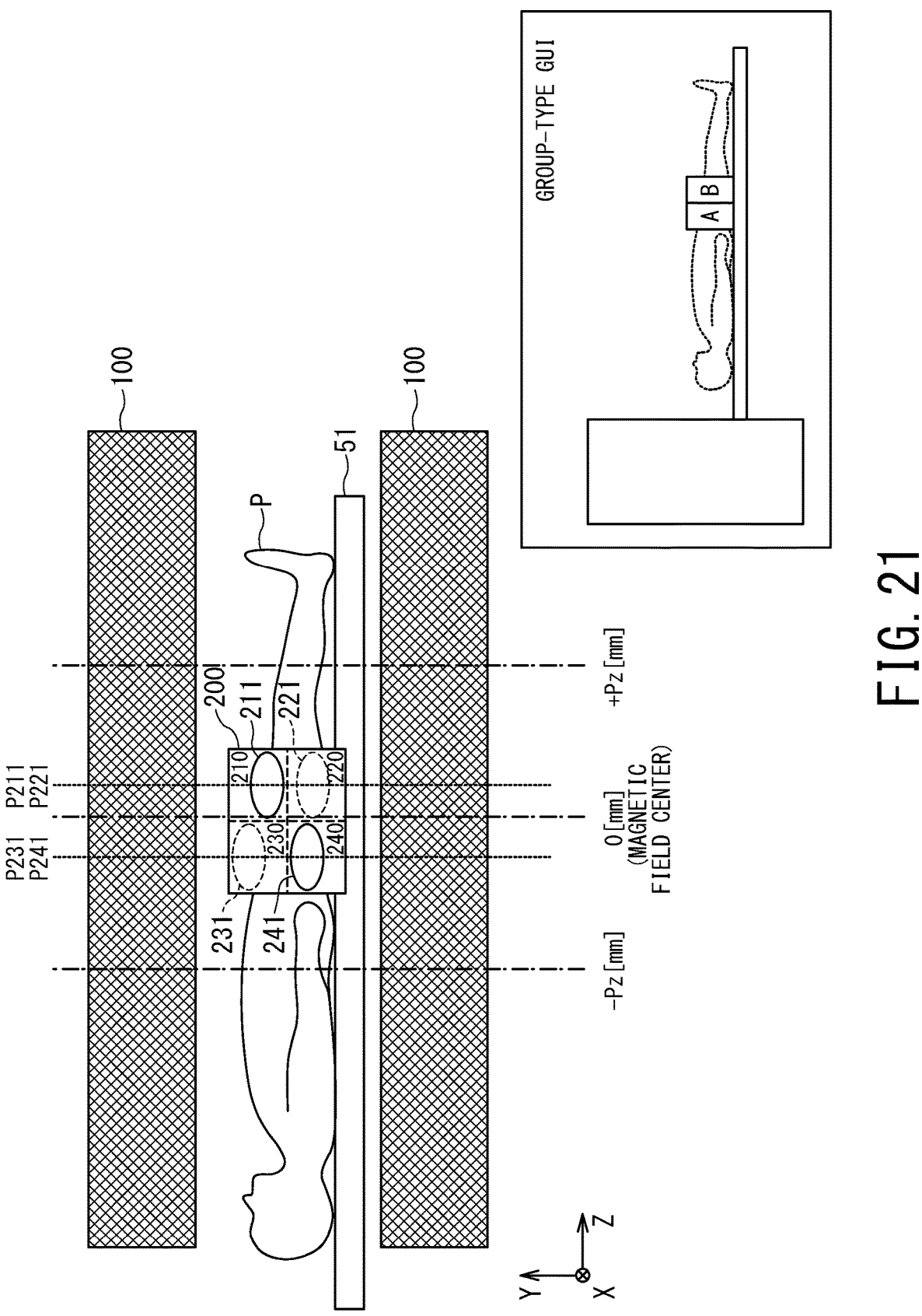
FIG. 21 is a schematic diagram illustrating the third disposition aspect of the RF coils and display of the selection support information.

FIG. 21 is a schematic diagram illustrating the third disposition aspect and display of the selection support information. As shown in FIG. 21, in the third disposition aspect, the RF coil 200 is deformed and folded around the Z-axis such as being wrapped around the thigh of the object P. Although only one case as the third disposition aspect will be described below, the same procedure can be used for other cases of the third disposition aspect to determine the disposition of the RF coil 200 relative to the table 51.

In the third disposition aspect, assuming that the magnetic field center is the reference position (Z=0 mm), and the MR signal of every representative coil of the RF coil 200 is detected while the respective Z-axis positions of the first to fourth representative coils are detected as P211=+50 mm, P221=+50 mm, P231=−50 mm, and P241=−50 mm. Under this assumption, the data table DT1 is selected for determining the disposition of the RF coil 200, and the positional relationship between two or more representative coils is derived on the basis of the calculation of the decision 11 and the decision 12 of the data table DT1. The calculation results of the decision 11 and the decision 12 are as follows.

$$P211-P241 = +100 \text{ mm}$$
$$P221-P231 = +100 \text{ mm}$$

Thus, referring to the data table DT1, the decision 11 is NO and the decision 12 is NO, and consequently, the disposition of the RF coil 200 is determined to be the case C3.

As described above, even if the RF coil 200 is deformed and folded around the Z-axis as in the third disposition aspect, the disposition of each RF coil 200 relative to the table 51 can be determined similarly to the first disposition aspect.

In the display aspect of the group-type GUI shown in the lower right part of FIG. 21, the group division figure A is composed of two sections of section3 and section4, and the group division figure B is composed of two sections of section1 and section2. Including the section-type GUI display (not shown), in the third disposition aspect, the disposition of the RF coil 200 can be distinguishably displayed in such a manner that the positional relationship between the plurality of sections in the RF coil 200 relative to the table 51 can be determined or distinguished, similarly to the first disposition aspect.

(Fourth Disposition Aspect)

Figure 22:
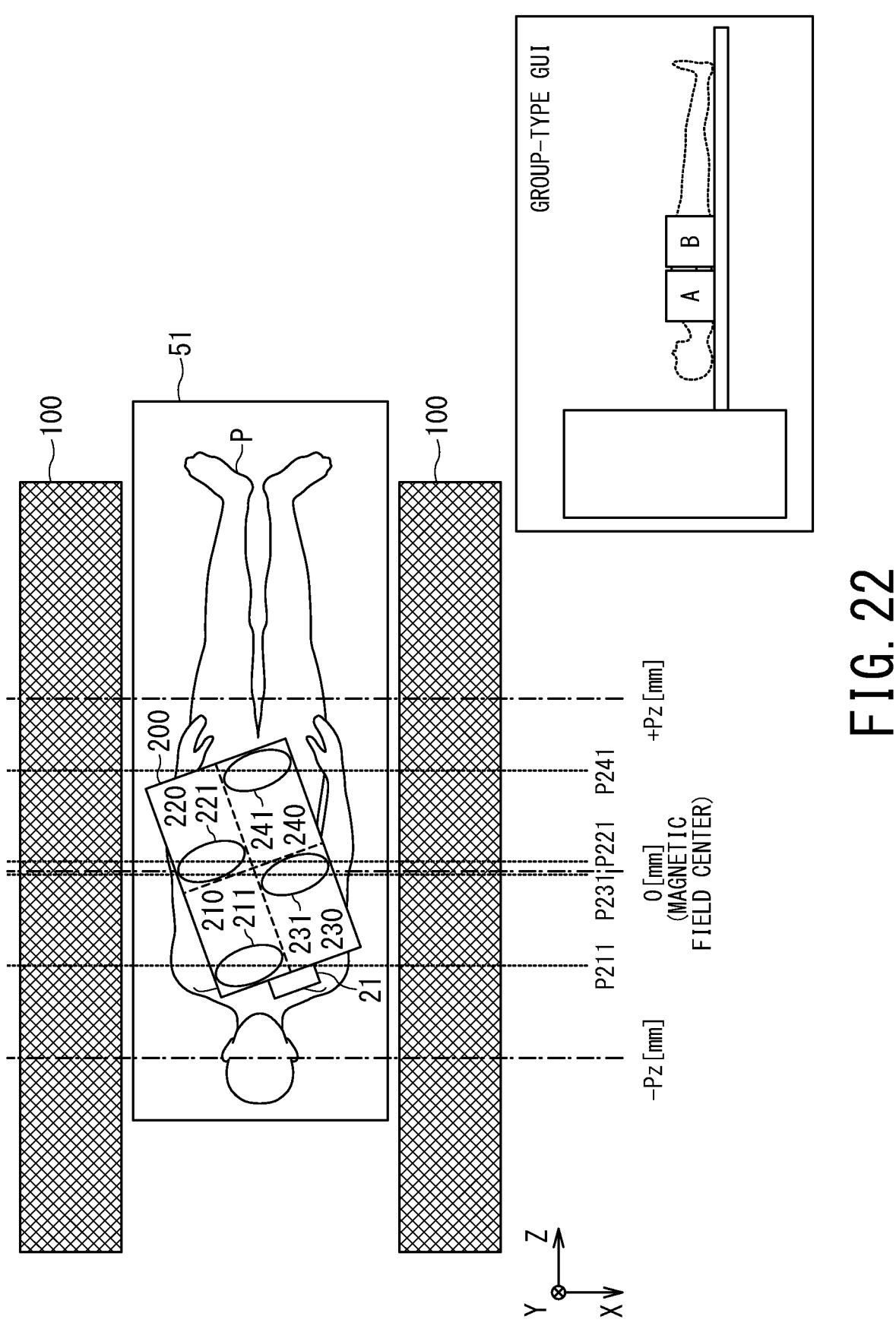
FIG. 22 is a schematic diagram illustrating the fourth disposition aspect of the RF coils and display of the selection support information.

FIG. 22 is a schematic diagram illustrating the fourth disposition aspect and display of the selection support information. As shown in FIG. 22, in the fourth disposition aspect, the disposition of the RF coil 200 has an angle relative to the table 51. Although only one case as the fourth disposition aspect will be described below, the same procedure can be used for other cases of the fourth disposition aspect to determine the disposition of the RF coil 200 relative to the table 51.

In the fourth disposition aspect, assuming that the magnetic field center is the reference position (Z=0 mm), and the MR signal of every representative coil of the RF coil 200 is detected while the respective Z-axis positions of the first to fourth representative coils are detected as P211=+150 mm, P221=+150 mm, P231=+50 mm, and P241=+50 mm. Under this assumption, the data table DT1 is selected for determining the disposition of the RF coil 200, and the positional relationship between two or more representative coils is derived on the basis of the calculation of the decision 11 and the decision 12 of the data table DT1. The calculation results of the decision 11 and the decision 12 are as follows.

$$P211-P241 = +100 \text{ mm}$$
$$P221-P231 = +100 \text{ mm}$$

Thus, referring to the data table DT1, the decision 11 is YES and the decision 12 is YES, and consequently, the disposition of the RF coil 200 is determined to be the case C1.

As described above, even if the disposition of the RF coil 200 has an angle relative to the table 51 as in the fourth disposition aspect, the disposition of each RF coil 200 relative to the table 51 can be determined similarly to the first disposition aspect. Also in the fourth disposition aspect as shown in the display aspect of the group-type GUI in FIG. 22, the group division figures A and B of the RF coil 200 may be used to distinguishably display the positional relationship between the plurality of sections of the RF coil 200 relative to the table 51, similarly to the first disposition aspect.

In the display aspect of the group-type GUI shown in FIG. 22, the group division figure A is composed of two sections of section1 and section3, and the group division figure B is composed of two sections of section2 and section4.

When the position P221 of the second representative coil and the position P231 of the third representative coil are exchanged according to the disposition of the RF coil 200 relative to the table 51, it is determined that the disposition of the RF coil 200 has changed. In this case, in the display aspect of the group-type GUI shown in FIG. 22, the group division figure A is composed of two sections of section1 and section2, and the group division figure B is composed of two sections of section3 and section4. Also in the fourth disposition aspect, including the section-type GUI display (not shown), the disposition of the RF coil 200 can be distinguishably displayed in such a manner that the positional relationship between the plurality of sections in the RF coil 200 relative to the table 51 can be determined, similarly to the first disposition aspect.

(Fifth Disposition Aspect)

Figure 23:
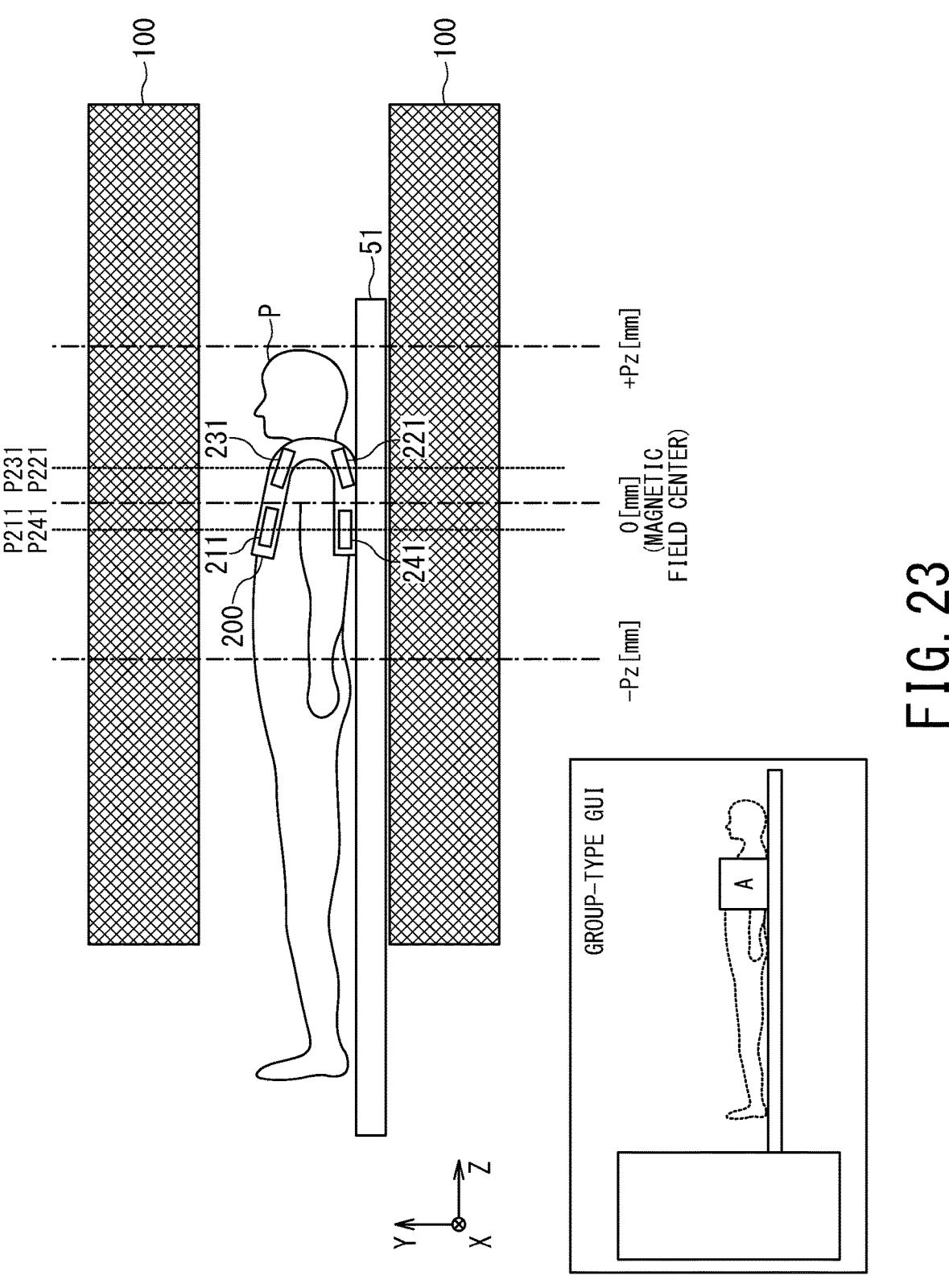
FIG. 23 is a schematic diagram illustrating the fifth disposition aspect of the RF coils and display of the selection support information.

FIG. 23 is a schematic diagram illustrating the fifth disposition aspect and display of the selection support information. As shown in FIG. 23, in the fifth disposition aspect, the RF coil 200 is deformed and folded around the X-axis, such as being wrapped around the shoulder of the object P. Although only one case as the fifth disposition aspect will be described below, the same procedure for other cases of the fifth disposition aspect can be used to determine the disposition of the RF coil 200 relative to the table 51.

In the fifth disposition aspect, assuming that the magnetic field center is the reference position (Z=0 mm), and the MR signal of every representative coil of the RF coil 200 is detected while the respective Z-axis positions of the first to fourth representative coils are detected as P211=−50 mm, P221=+50 mm, P231=+50 mm, and P241=−50 mm. Under this assumption, the data table DT1 is selected for determining the disposition of the RF coil 200, and the positional relationship between two or more representative coils is derived on the basis of the calculation of the decision 11 and the decision 12 of the data table DT1. The calculation results of the decision 11 and the decision 12 are as follows.

$$P211-P241 = 0 \text{ mm}$$

$$P221-P231 = 0 \text{ mm}$$

In this manner, when both P211 and P241 are at approximately the same positions and both P221 and P231 are at approximately the same positions, it is recognized that the RF coil 200 is deformed and folded around the X-axis.

As described above, even if the RF coil 200 is deformed and folded around the X-axis relative to the table 51 as in the fifth disposition aspect, the disposition of each RF coil 200 relative to the table 51 can be determined. In the display aspect of the group-type GUI shown in FIG. 23, the group division figure A is composed of four sections of section1 and section2, section3 and section4. In this aspect, it may simply display group division figure A without distinguishing the positional relationship between the plurality of sections in the RF coil 200 relative to the table 51.

Second Embodiment

Figure 24:
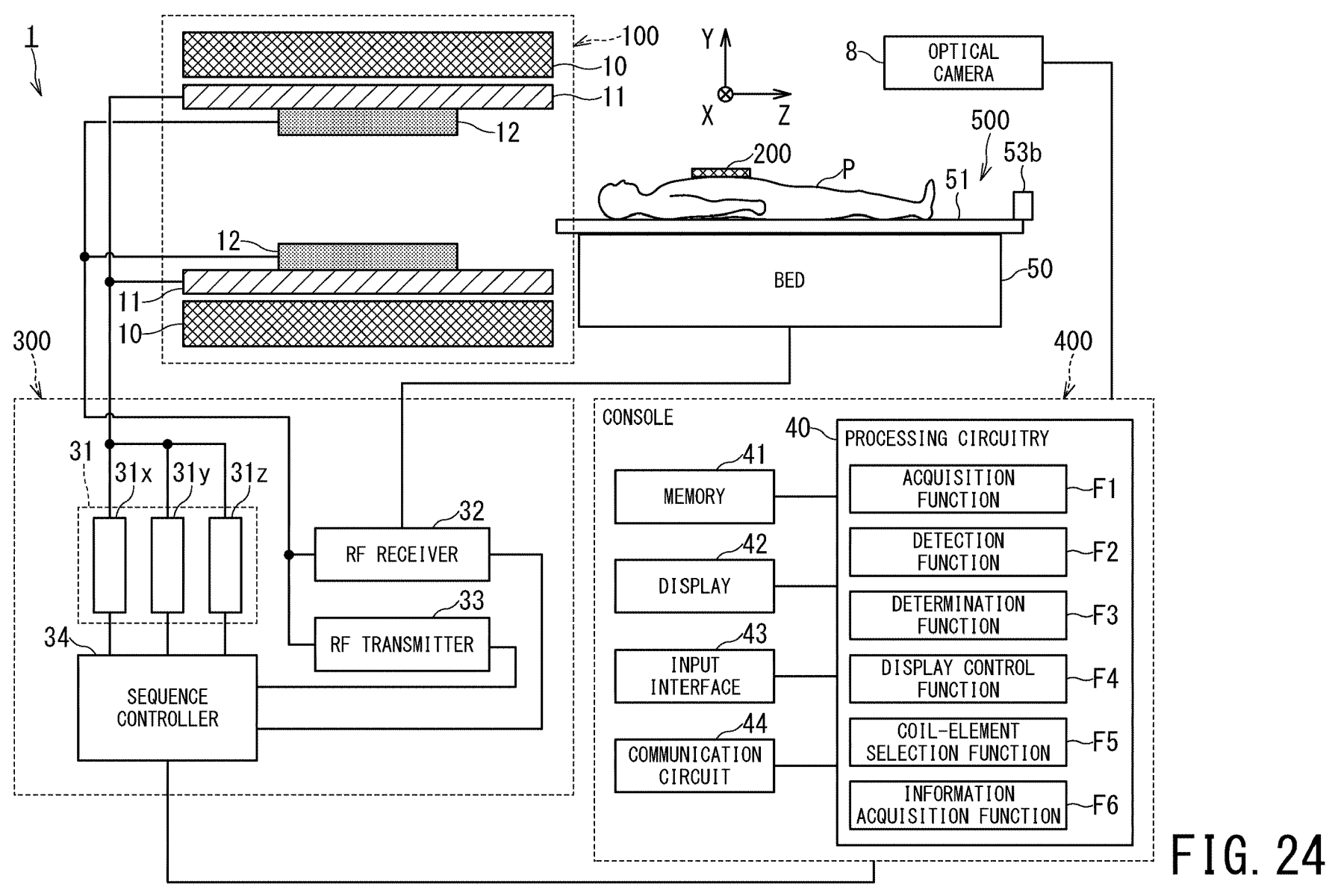

FIG. 24 is a schematic diagram illustrating an overall configuration of the MRI apparatus 1 according to the second embodiment. As shown in FIG. 24, the MRI apparatus 1 according to the second embodiment further includes an optical camera 8 with the processor in the processing circuitry 40 implementing an information acquisition function F6. The second embodiment differs from the first embodiment in that the information on the position of the RF coil 200 obtained from at least one optical image is further used for determining the disposition of the RF coil(s) 200.

Figure 25:
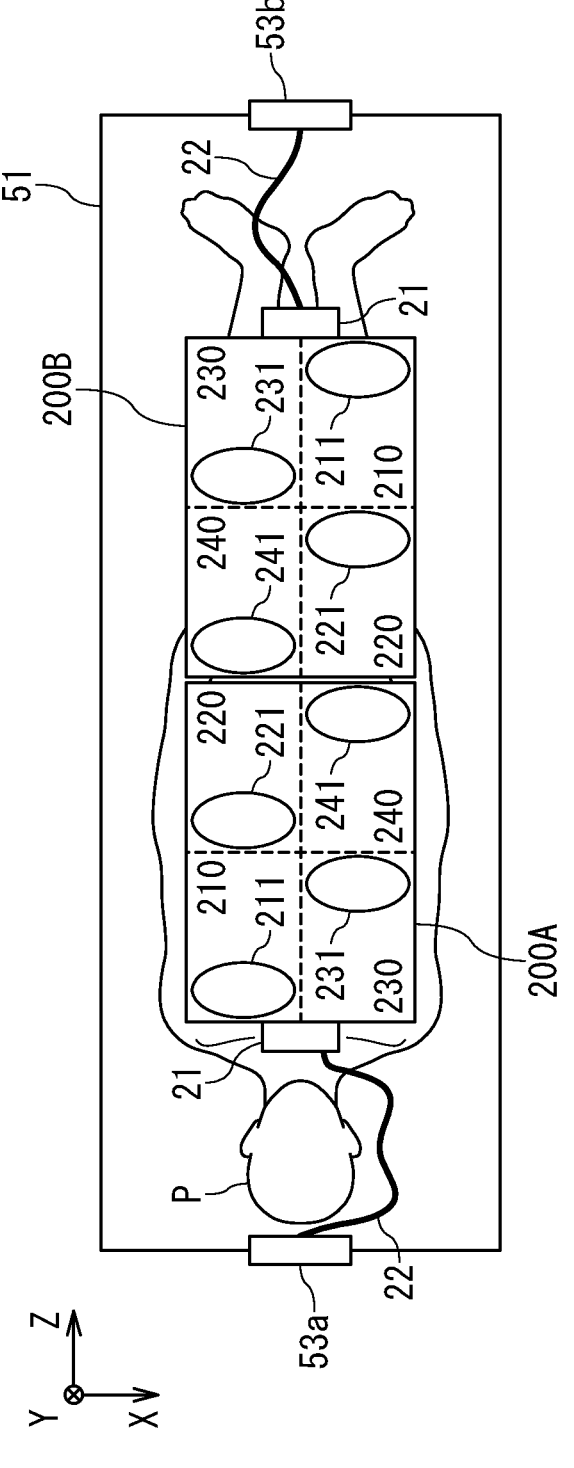
FIG. 25 is a schematic diagram illustrating disposition of the RF coils according to the second embodiment.
Figure 26:
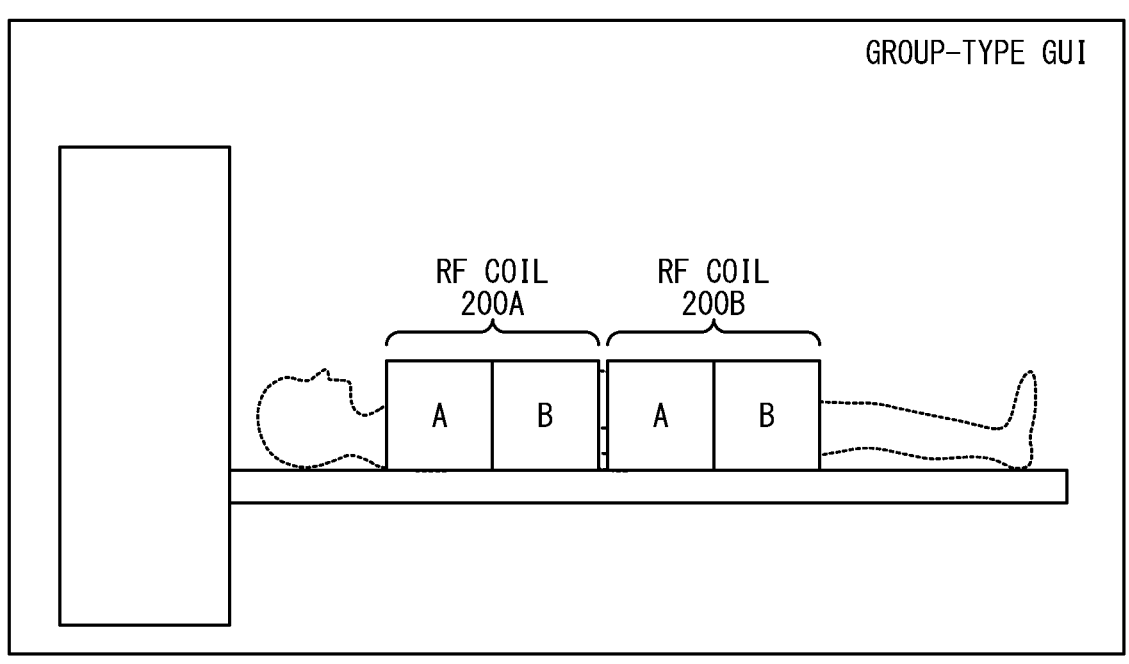
FIG. 26 is a schematic diagram illustrating display of the selection support information according to the second embodiment.
Figure 26:
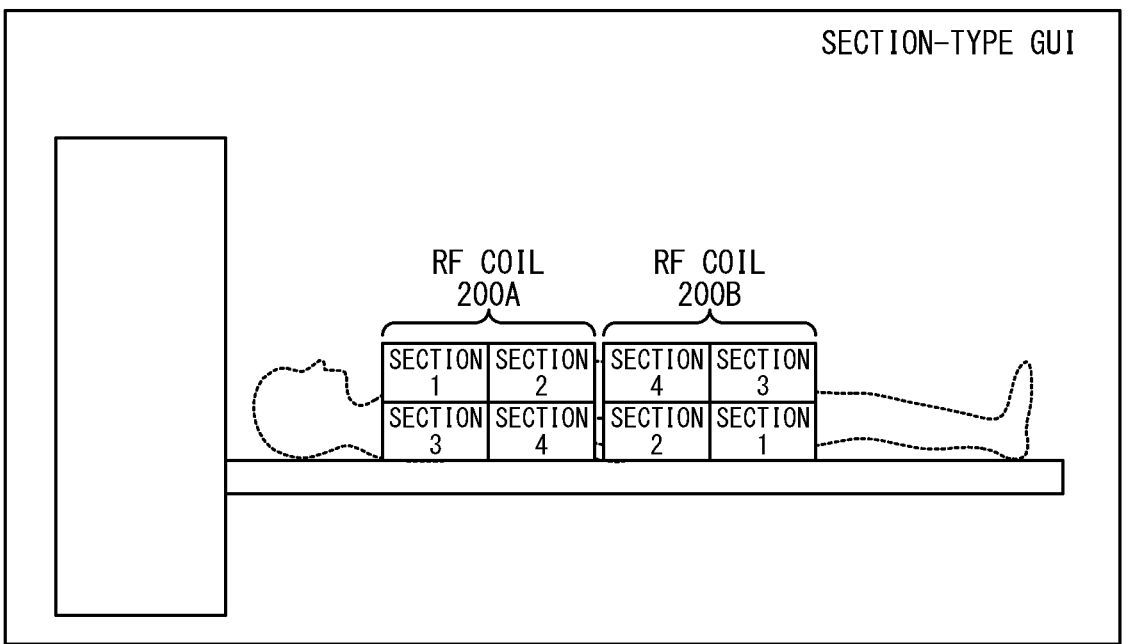

FIG. 25 is a schematic diagram illustrating the disposition of the RF coils 200 according to the second embodiment. As shown in FIG. 25, in the second embodiment, two RF coils 200 are disposed on the object P, and the configuration is substantially the same as the configuration of the MRI apparatus 1 according to the first embodiment except the optical camera 8 and the information acquisition function F6. Thus, the same reference signs are given to the same components and duplicate description is omitted. Although two RF coils 200A and 200B are structurally and functionally equivalent to each other, they are given different reference signs for distinguishing the difference in disposition as shown in FIG. 25 and FIG. 26.

The optical camera 8 is installed on the ceiling of the imaging room where the MRI apparatus 1 is installed, for example. The optical camera 8 includes an optical lens, an image sensor, an amplifier, and an A/D (Analog to Digital) converter (not shown), for example. The optical lens is an optical element that refracts and focuses light. The image sensor images an object through an objective optical system. The amplifier amplifies the output video signal from the image sensor. The A/D converter converts the analog video signal outputted from the amplifier into a digital signal. The optical camera 8 is connected to the processing circuitry 40, and the optical image is outputted to the processing circuitry 40 as a digital signal.

The optical camera 8 images all or part of the table 51 from above before the table 51 enters the gantry 100, and generates an optical image including the RF coils 200 disposed on the object P that is placed on the table 51. In other words, after setting the RF coils 200, the optical image is acquired before moving the table 51 horizontally and moving the object P into the bore. As the optical image depicting the RF coils 200, the optical camera 8 can acquire a moving image obtained by time-sequentially imaging the table 51 at a predetermined frame rate, for example. The optical camera 8 is not limited to be installed on the ceiling, but may be fixed to a cover that covers the gantry 100 or may be attached to the gantry 100 or a wall around the gantry 100, for example.

Since the RF coil 200 can be disposed in an arbitrary orientation with either its front surface or its back surface brought into contact with the object P, in some cases, the optical image acquired by the optical camera 8 does not include sufficient information for determining the disposition of the RF coil 200. However, information on the installation position and the installation range of the RF coil 200 can be obtained. For example, if a plurality of RF coils 200 is disposed on the object P, information on the positional relationship between each RF coil 200 and the information on possible overlap between respective RF coils 200 can also be acquired.

The information acquisition function F6 acquires information on the position of the RF coils 200 obtained from one or more optical images. The acquisition of the information on the position of the RF coils 200 by the information acquisition function F6 is performed before the step ST10 in the flowchart of FIG. 5, for example.

The information on the position of each RF coil 200 obtained from the optical image can be used together in the determination of the disposition of the RF coil 200 relative to to the table 51 in other embodiments. The determination function F3 determines the disposition of the RF coils 200 relative to the table 51 on the basis of both the information on the position of each RF coil 200 obtained from the optical image and the respective positions of the plurality of representative coils obtained from the MR signals.

For example, from the information on the position of the RF coil 200 obtained from the optical image, the information acquisition function F6 can acquire information such as relative positional relationship between two or more RF coils 200 and the installation state of the RF coil 200, including a case where the RF coil 200 is deformed and folded or tilted at a predetermined angle relative to the table 51. For example, even when there is a representative coil where the MR signal is not detected, the GUI can display the disposition of the RF coil 200 provisionally by using the information on the positions of the RF coils 200 obtained from the optical image. In addition, when the MR signal is newly detected from the representative coil where the MR signal was not detected after moving the table 51, the disposition of the RF coil(s) 200 may be determined again and the GUI display may be updated. Further, when there is a deviation between the positions of the RF coils 200 obtained from the optical image and the position of each of the plurality of representative coils obtained from the MR signals, the GUI display may be adjusted on the basis of the information on the positions of the RF coils 200 obtained from the optical image.

According to the MRI apparatus 1 of the second embodiment, even when determination is difficult, as exemplified by a case where the MR signal of at least one of the representative coils is not detected, the disposition of the RF coils 200 can be more accurately determined on the basis of the positions of the RF coils 200 obtained from the optical image.

FIG. 26 is a schematic diagram illustrating display of the selection support information according to the second embodiment. In the display aspect of the group-type GUI shown in the upper part of FIG. 26, regarding the RF coil 200A, the group division figure A is composed of two sections of section1 and section3, and the group division figure B is composed of two sections of section2 and section4. Regarding the RF coil 200B, the group division figure A is composed of two sections of section4 and section2, and the group division figure B is composed of two sections of section3 and section1. In the display aspect of the section-type GUI shown in the lower part of FIG. 26, the disposition of the RF coils 200 can be distinguishably displayed in such a manner that the positional relationship between the plurality sections of RF coils 200 relative to the table 51 can be determined.

Third Embodiment

In the third embodiment, the processor of the processing circuitry 40 implements the information acquisition function F6. The third embodiment differs from the first embodiment in that the information on the positions of the RF coils 200 estimated from the information on the position of each connection port is further used for determining the disposition of the RF coils 200. FIG. 25 is also a schematic diagram illustrating the disposition according to the third embodiment. As shown in FIG. 25, in the third embodiment, two RF coils 200 are disposed on the object P, and the configuration is substantially the same as the configuration of the MRI apparatus 1 according to the first embodiment except the optical camera 8 and the information acquisition function F6. Thus, the same reference signs are given to the same components and duplicate description is omitted.

The table 51 has connection ports 53*a* and 53*b* at a plurality of locations, and each of the connection ports 53*a* and 53*b* is connectable to the RF coil 200. Hereinbelow, though a description has been given of the case where the number of the connection ports are two, one or more than two connection ports may be installed. The connection ports 53*a* and 53*b* are provided at different positions along the longitudinal direction of the table 51, such as both ends of the table 51. The RF coils 200A and 200B are connected to the MRI apparatus 1 via the connection ports 53*a* and 53*b*, and the connection information of the RF coils 200A and 200B is processed by the processor of the processing circuitry 40.

The installation positions of the RF coils 200A and 200B can be estimated from the connection information of the connection ports 53*a* and 53*b* at different positions to which at least one of the RF coils 200A and 200B is connected, as well as information on the dimensions of the body and cable of each of the RF coils 200A and 200B. For example, when there are two connection ports 53*a* and 53*b* as shown in FIG. 25, it is presumed that one RF coil 200A connected to the connection port 53*a* is located on the side of the connection port 53*a* and the other RF coil 200B connected to the other connection port 53*b* is located on the side of the other connection port 53*b*.

The information acquisition function F6 acquires information on the positions of the RF coils 200A and 200B, which are estimated from the connection information of the connection ports to which the respective RF coils 200A and 200B are connected. The acquisition of the information on the position of each RF coil 200 by the information acquisition function F6 is performed before the step ST10 in the flowchart of FIG. 5, for example.

The determination function F3 determines the disposition of the RF coils 200 relative to the table 51 on the basis of the information on the position of each RF coil 200 estimated from the connection information of the connection ports and the respective positions of the plurality of representative coils obtained from the MR signals. The information on the position of each RF coil 200 estimated from the connection information of the connection port can be used together in the determination of the disposition of the RF coils 200 relative to the table 51 in other embodiments.

When the position where the MR signal is detected deviates from the position of the RF coil 200 estimated from the connection information of the connection port where this RF coil 200 is connected, for example, when the MR signal is detected at a position where the RF coil 200 should not exist based on the dimensions of the main body and the cable of the RF coil 200, a warning indicative of this fact may be presented to the user.

The selection support information according to the third embodiment can be displayed in the same manner as the display aspect of the selection support information according to the second embodiment in FIG. 26. According to the MRI apparatus 1 of the third embodiment, even if determination is difficult, as exemplified by the case where the MR signal of one or more representative coils is detected, the disposition of the RF coils 200 can be more accurately determined on the basis of the position of each RF coil 200 estimated from the connection information of the connection ports.

(Other Disposition Aspects and GUI Display)

Figure 27:
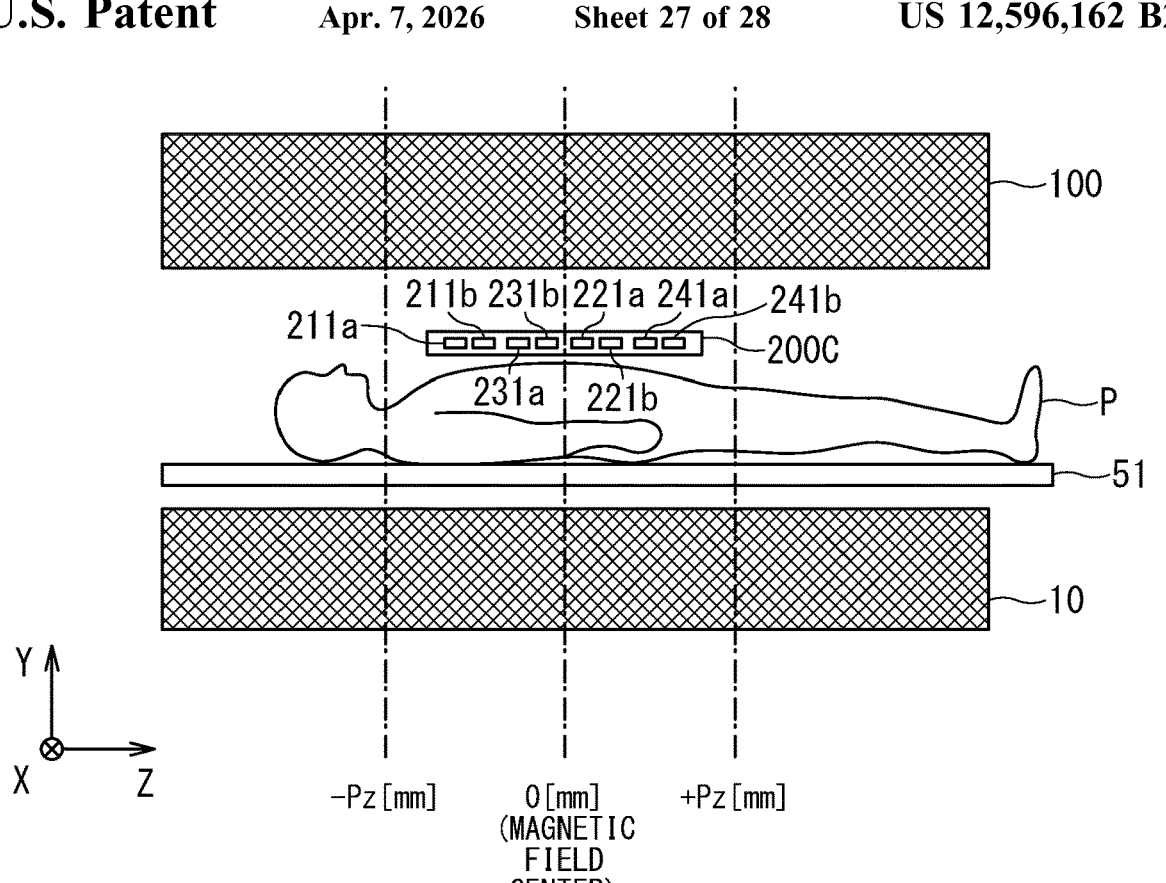
FIG. 27 is a schematic diagram illustrating another first disposition aspect of the RF coils and display of the selection support information.
Figure 27:
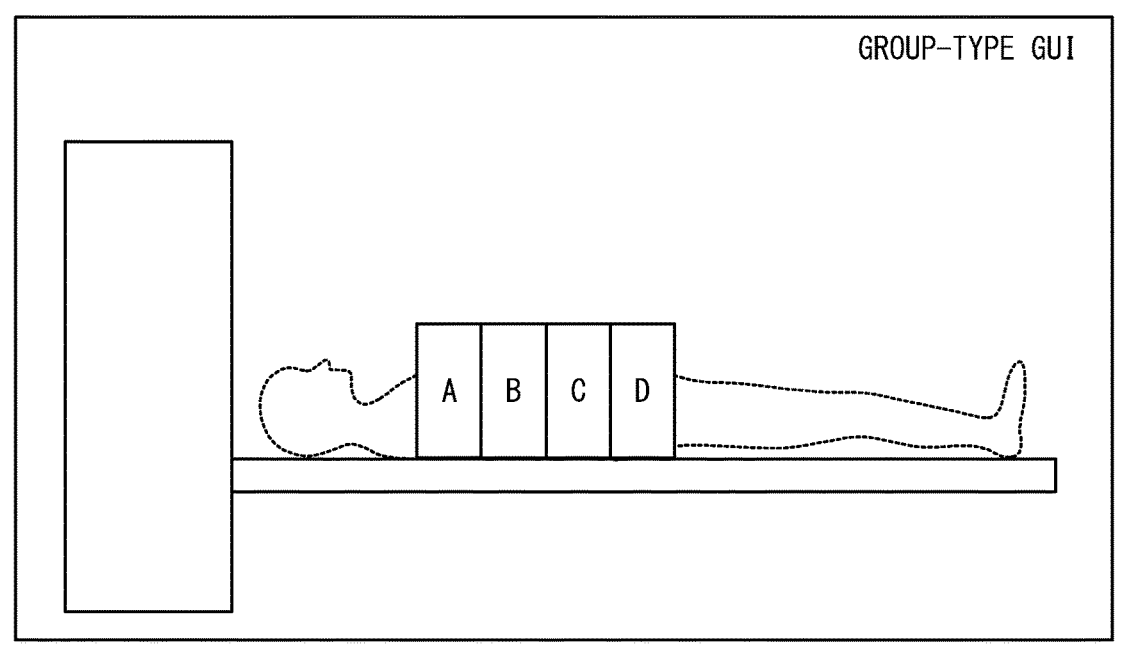

FIG. 27 is a schematic diagram illustrating another first disposition aspect of the RF coil 200C and display of the selection support information. The RF coil 200C of another first disposition aspect is composed of eight representative coils, i.e., is divided into eight sections. As shown in FIG. 27, each of the group division figures A, B, C, and D of the RF coil 200C is composed of two sections having two representative coils. In this manner, the methods of dividing the RF coil 200C into sections and the group division figures, shown as the display aspect of the selection support information, may be changed depending on the length of the RF coil 200C in the first and second directions, the number and the disposition of the representative coils, as well as the number and the disposition of coil elements, for example.

Figure 28:
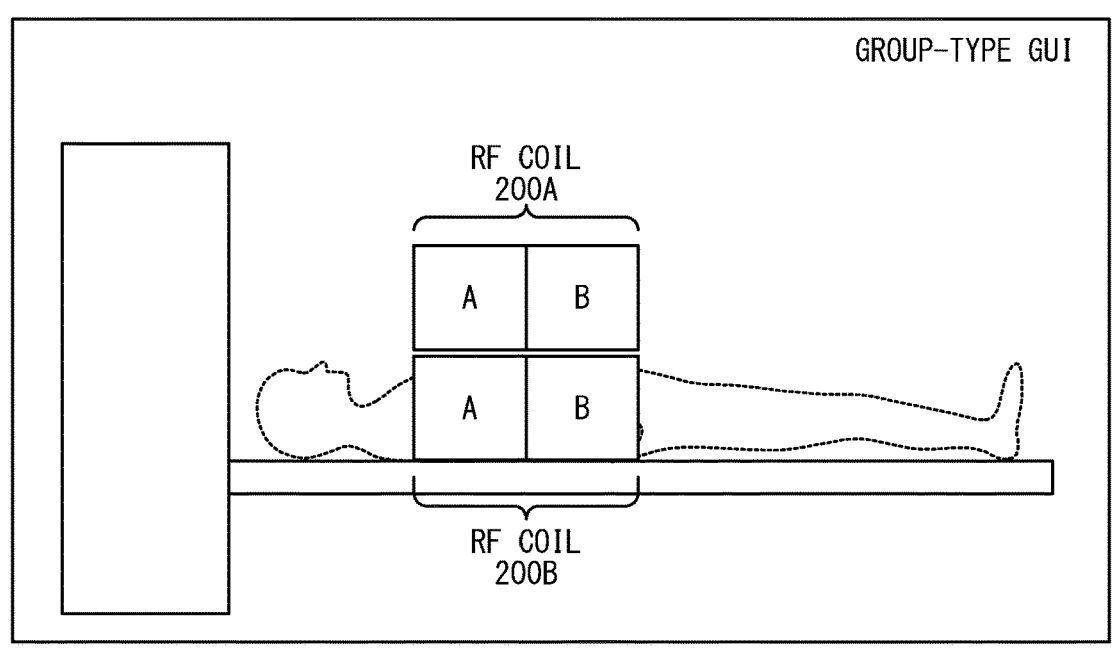
FIG. 28 is a schematic diagram illustrating another second disposition aspect of the RF coils and display of the selection support information.

FIG. 28 is a schematic diagram illustrating another second disposition aspect of the RF coils 200A and 200B and display of the selection support information. In another second disposition aspect, two RF coils 200A and 200B are disposed on the object P. As shown in FIG. 28, one RF coil 200A is disposed on the abdominal side of the object P, the other RF coil 200B is disposed on the dorsal side of the object P, and both RF coils 200A and 200B are disposed at approximately the same position in the Z-axis direction. In this case, the disposition of each of the RF coils 200A and 200B can also be determined in the same manner as the above-described method. In the group-type GUI display, one RF coil 200A and the other RF coil 200B may be superimposed and displayed at the same position in the Z-axis. The information on the position of the RF coil 200 obtained from the optical image of the MRI apparatus 1 according to the second embodiment may be additionally applied to determine whether each of the RF coils 200A and 200B is disposed on the dorsal side or the dorsal side of the object P.

According to at least one embodiment described above, with respect to an RF coil that can be installed in an arbitrary orientation with either its front surface or back surface brought into contact with the object, the disposition of the RF coil relative to the table can be determined.

In the above-described embodiments, the term "processor" means a circuit such as a special-purpose or general purpose CPU (Central Processing Unit), a GPU (Graphics Processing Unit), an ASIC (Application Specific Integrated Circuit), a programmable logic device including an SPLD (Simple Programmable Logic Device) and a CPLD (Complex Programmable Logic Device), and an FPGA (Field Programmable Gate Array), for example. The processor implements various functions by reading in and executing the programs stored in the memory.

Although a description has been given of the case where a single processor of the processing circuitry 40 achieves the respective functions in the above-described embodiments, the processing circuitry 40 may be configured by combining a plurality of independent processors in such a manner that each processor implements each function. Further, when a plurality of processors are provided, a memory for storing the programs may be provided for each processor or a single memory may collectively store the programs corresponding to the functions of all the processors.

While certain embodiments have been described, these embodiments have been presented by way of example only, and are not intended to limit the scope of the invention. Indeed, the novel methods and systems described herein may be embodied in a variety of other forms; furthermore, various omissions, substitutions and changes in the form of the methods and systems described herein may be made without departing from the scope of the invention as defined by the appended claims.

What is claimed is:

1. An MRI apparatus, comprising:
an RF coil that includes a plurality of coil elements and is configured to be installed in an arbitrary orientation with either a front surface or a back surface brought into contact with an object;
a table on which the object is placed;
a memory configured to store a data table in which a positional relationship between two or more representative coils and the disposition of the RF coil relative to the table are associated with each other; and
processing circuitry configured to
  acquire a magnetic resonance (MR) signal in a first scan along any one axis from each of a plurality of representative coils selected from the plurality of coil elements,
  detect respective positions of the plurality of representative coils along the one axis based on the MR signals,
  derive the positional relationship between the two or more representative coils from the detected respective positions of the plurality of representative coils, and
  determine a disposition of the RF coil relative to the table based on the respective positions of the plurality of representative coils by using the derived positional relationship between the two or more representative coils and referring to the data table.

2. The MRI apparatus according to claim 1, wherein each of the plurality of the representative coils is selected from one or more coil elements in each of a plurality of sections obtained by dividing a development plane of the RF coil into a plurality of regions in such a manner that each representative coil represents each section.

3. The MRI apparatus according to claim 1, wherein the disposition of the RF coil relative to the table is defined by a combination of the front surface and the back surface of the RF coil and an orientation of the RF coil relative to the table.

4. The MRI apparatus according to claim 1, wherein each representative coil is composed of at least one coil element.

5. The MRI apparatus according to claim 2, wherein each representative coil is composed of at least one coil element.

6. The MRI apparatus according to claim 2, wherein the plurality of sections are four sections obtained by dividing the development plane of the RF coil into two in a first direction and into two in a second direction that is orthogonal to the first direction.

7. The MRI apparatus according to claim 2, wherein the plurality of sections are obtained by dividing the development plane of the RF coil into two or more in at least one of a first direction and a second direction that are orthogonal to each other.

8. The MRI apparatus according to claim 2, wherein:
the plurality of sections are obtained by dividing the development plane of the RF coil into two or more in at least one of a first direction and a second direction that are orthogonal to each other; and
the plurality of representative coils are selected in a such manner that two representative coils adjacent in the second direction are different in position in the first direction or two representative coils adjacent in the first direction are different in position in the second direction.

9. The MRI apparatus according to claim 1, wherein the one axis is an axis along a longitudinal direction of the table.

10. The MRI apparatus according to claim 1, wherein the processing circuitry is further configured to:

acquire the MR signals along a first axis and a second axis orthogonal to each other, the first axis being the one axis;

detect respective positions of the plurality of representative coils along the first axis and the second axis based on the MR signals; and determine the disposition of the RF coil relative to the table based on the respective positions of the plurality of representative coils detected along the first axis and the second axis.

11. The MRI apparatus according to claim 1, wherein the processing circuitry is further configured to detect the respective positions of the plurality of representative coils along the one axis based on profile data indicating a reception intensity distribution of the MR signals in the first scan.

12. The MRI apparatus according to claim 1, wherein, in determining the disposition of the RF coil relative to the table, the processing circuitry is further configured to exclude a position of a representative coil having a peak intensity in a reception intensity distribution of the MR signals that is equal to or less than a preset predetermined threshold.

13. The MRI apparatus according to claim 1, wherein, when a peak intensity in a reception intensity distribution of the MR signals is equal to or less than a predetermined threshold for at least one representative coil, the processing circuitry is further configured to determine the disposition of the RF coil relative to the table using the data table, which is selected based on the peak intensity in the reception intensity distribution of the MR signals being equal to or less than the predetermined threshold for the at least one representative coil.

14. The MRI apparatus according to claim 1, wherein the processing circuitry is further configured to:

derive a positional relationship between two of the plurality of representative coils based on an arithmetic operation related to positions of the two representative coils and a combination of the arithmetic operation; and determine the disposition of the RF coil relative to the table by using the derived positional relationship.

15. The MRI apparatus according to claim 14, wherein:

when an absolute value of an arithmetic operation value regarding respective positions of the two representative coils is less than a predetermined threshold, the processing circuitry is further configured to determine that the two representative coils are at almost a same position along the one axis by using the derived positional relationship; and when the absolute value of the arithmetic operation value regarding respective positions of the two representative coils is equal to or larger than the predetermined threshold, the processing circuitry is configured to determine that each of the two representative coils is at a position indicated by the arithmetic operation value along the one axis by using the derived positional relationship.

16. The MRI apparatus according to claim 2, further comprising a display, wherein the processing circuitry is further configured to cause the display to display selection support information enabling a user to select at least one coil element in the RF coil based on determined disposition of the RF coil relative to the table.

17. The MRI apparatus according to claim 16, wherein the selection support information includes information on at least one coil element that is to be used for a second scan as selected from among the plurality of coil elements provided in the RF coil based on information on an anatomical imaging part and an imaging condition.

18. The MRI apparatus according to claim 16, wherein:

the selection support information is at least one section division figure that distinguishably indicates a positional relationship of the plurality of sections in the RF coil relative to the table; and the processing circuitry is further configured to select at least one coil element belonging to one or plural sections specified based on the section division figure as a coil element to be used for a second scan from among the plurality of coil elements provided in the RF coil.

19. The MRI apparatus according to claim 16, wherein:

the selection support information is at least one group division figure that distinguishably indicates a positional relationship of a plurality of groups relative to the table, the plurality of groups being obtained by dividing the RF coil into a plurality of regions in a longitudinal direction of the table; and the processing circuitry is further configured to select at least one coil element belonging to one or plural groups specified based on the group division figure as a coil element to be used for a second scan from among the plurality of coil elements provided in the RF coil.

20. The MRI apparatus according to claim 1, further comprising an optical camera configured to generate an optical image in which the RF coil is depicted, wherein the processing circuitry is further configured to:

acquire information on a position of the RF coil obtained from the optical image; and determine the disposition of the RF coil relative to the table based on information on the position of the RF coil obtained from the optical image and respective positions of the plurality of representative coils obtained from the MR signals.

21. The MRI apparatus according to claim 1, wherein:

the table is provided with a plurality of connection ports at a plurality of locations, each of the plurality of connection ports being connectable to the RF coil; and the processing circuitry is further configured to acquire information on the position of the RF coil estimated from connection information of a connection port to which the RF coil is connected, and determine the disposition of the RF coil relative to the table based on both respective positions of the plurality of representative coils obtained from the MR signals and information on the position of the RF coil estimated from the connection information of a connection port to which the RF coil is connected.

* * * * *